US010700650B1

(12) United States Patent
Ayranci et al.

(10) Patent No.: US 10,700,650 B1
(45) Date of Patent: Jun. 30, 2020

(54) CONFIGURABLE WIDEBAND SPLIT LNA

(71) Applicant: pSemi Corporation, San Diego, CA (US)

(72) Inventors: Emre Ayranci, Costa Mesa, CA (US); Miles Sanner, San Diego, CA (US); Phanindra Yerramilli, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/242,883

(22) Filed: Jan. 8, 2019

(51) Int. Cl.
*H03F 3/191* (2006.01)
*H03F 3/195* (2006.01)
*H03F 1/56* (2006.01)
*H04B 1/16* (2006.01)

(52) U.S. Cl.
CPC ............ *H03F 3/195* (2013.01); *H03F 1/565* (2013.01); *H04B 1/16* (2013.01); *H03F 2200/111* (2013.01); *H03F 2200/129* (2013.01); *H03F 2200/213* (2013.01); *H03F 2200/222* (2013.01); *H03F 2200/294* (2013.01); *H03F 2200/387* (2013.01); *H03F 2200/451* (2013.01); *H03F 2200/489* (2013.01)

(58) Field of Classification Search
CPC ...................................... H03F 3/191
USPC ................................ 330/302, 305
See application file for complete search history.

(56) References Cited

U.S. PATENT DOCUMENTS

| 6,804,502 | B2 | 10/2004 | Burgener et al. |
| 7,612,616 | B2 | 11/2009 | Deng et al. |
| 7,910,993 | B2 | 3/2011 | Brindle et al. |
| 8,018,288 | B2 | 9/2011 | Duster et al. |
| 8,073,400 | B2 | 12/2011 | Gorbachov |
| 9,077,290 | B2 | 7/2015 | Din et al. |
| 9,407,215 | B2 | 8/2016 | Gill |
| 9,479,126 | B2 | 10/2016 | Ilkov et al. |
| 9,748,985 | B2 | 8/2017 | Zhang et al. |
| 9,973,149 | B2 | 5/2018 | Ayranci et al. |
| 10,348,262 | B2 * | 7/2019 | Lee .......... H03F 1/223 |

(Continued)

FOREIGN PATENT DOCUMENTS

| CN | 108336976 | 7/2018 |
| EP | 2959578 | 12/2015 |

(Continued)

OTHER PUBLICATIONS

Voung, Quochien B., Office Action received from the USPTO dated Nov. 15, 2019 for U.S. Appl. No. 16/242,870, 14 pgs.

(Continued)

*Primary Examiner* — Henry Choe
(74) *Attorney, Agent, or Firm* — Jaquez Land Greenhaus LLP; Alessandro Steinfl, Esq.

(57) ABSTRACT

Methods and devices addressing design of wideband LNAs with gain modes are disclosed. The disclosed teachings can be used to reconfigure RF receiver front-end to operate in various applications imposing stringent and conflicting requirements. Wideband and narrowband input and output matching with gain modes using a combination of the same hardware and a switching network are also disclosed. The described methods and devices also address carrier aggregation requirements and provide solutions that can be used both in single-mode and split-mode operations.

28 Claims, 25 Drawing Sheets

(56) References Cited

U.S. PATENT DOCUMENTS

| | | |
|---|---|---|
| 2008/0231366 A1 | 9/2008 | Roufoogaran |
| 2010/0164498 A1 | 7/2010 | Helvoort et al. |
| 2010/0321113 A1 | 12/2010 | Kathiresan et al. |
| 2013/0316671 A1 | 11/2013 | Stockinger et al. |
| 2014/0240048 A1 | 8/2014 | Youssef et al. |
| 2016/0065264 A1 | 3/2016 | Wu et al. |
| 2018/0019710 A1 | 1/2018 | Ayranci et al. |
| 2018/0062600 A1* | 3/2018 | Lee .................. H04B 7/08 |
| 2018/0175797 A1* | 6/2018 | Lee .................. H03F 1/56 |
| 2019/0207639 A1* | 7/2019 | Hageraats ............ H04B 1/40 |

FOREIGN PATENT DOCUMENTS

| | | |
|---|---|---|
| EP | 2974003 | 1/2016 |
| WO | 2018013206 | 1/2018 |

OTHER PUBLICATIONS

Mottola, Steven J., Office Action received from the USPTO dated Sep. 5, 2017 for U.S. Appl. No. 15/342,016, 11 pgs.

Mottola, Steven J., Notice of Allowance received from the USPTO dated Feb. 1, 2018 for U.S. Appl. No. 15/342,016, 14 pgs.

Zhang, et al., "Linearization Techniques for CMOS Low Noise Amplifiers: A Tutorial", IEEE Transactions on Circuits and Systems-I: Regular Papers, vol. 58, No. 1, Jan. 2011, pp. 22-36.

Denini, Monica, International Search Report and Written Opinion received from the EPO dated Aug. 4, 2017 for appln. No. PCT/US2017/032157, 18 pgs.

Ayranci, et al., Response file in the USPTO dated Dec. 5, 2017 for U.S. Appl. No. 15/342,016, 11 pgs.

Ayranci, et al., Response file in the USPTO dated Feb. 9, 2018 for U.S. Appl. No. 15/342,016, 4 pgs.

Ayranci, et al., "5G NR Configurable Wideband RF Front-End LNA", patent application filed in the USPTO on Jan. 8, 2019, U.S. Appl. No. 16/242,870, 45 pgs.

Ayala Perriello, International Search Report and Written Opinion received from the EPO dated Apr. 3, 2020 for appln. No. PCT/US2020/012745, 40 pgs.

* cited by examiner

| Wideband mode | Gain Flatness | Linearity | Area | Current |
|---|---|---|---|---|
| Architecture of Fig. 2A | Worst | Typical | Best | Typical |
| Architecture of Fig. 2B | Best | Best | Typical | Typical |
| Architecture of Fig. 2C | Typical | Typical | Worst | Typical |

Fig. 2D

| switch state | S1 | S2 | S3 | S4 | S5 | S6 | S7 | S8 | S9 | S10 | S11 | S12 |
|---|---|---|---|---|---|---|---|---|---|---|---|---|
| | a-a' | b-b'/b-b'' | c-c' | d-d' | e-e' | f-f' | g-g' | h-h' | i-i' | j-j' | k-k' | l-l' |
| | closed | b-b' | closed | open | open | open | open | open | closed | open | closed | open |

| | S1 | S2 | S3 | S4 | S5 | S6 | S7 | S8 | S9 | S10 | S11 | S12 |
|---|---|---|---|---|---|---|---|---|---|---|---|---|
| | a-a' | b-b'/b-b" | c-c' | d-d' | e-e' | f-f' | g-g' | h-h' | i-i' | j-j' | k-k' | l-l' |
| switch state | closed | b-b" | open | open | closed | open | closed | closed | open | closed | open | open |

| switch state | S1 | S2 | S3 | S4 | S5 | S6 | S7 | S8 | S9 | S10 | S11 | S12 |
|---|---|---|---|---|---|---|---|---|---|---|---|---|
| a-a' | open | | | | | | | | | | | |
| b-b'/b-b'' | b-b'' | c-c' | d-d' | e-e' | f-f' | g-g' | h-h' | i-i' | j-j' | k-k' | l-l' |
| | | open | open | open | open | closed | open | open | closed | closed | open | open |

| | S1 | S2 | S3 | S4 | S5 | S6 | S7 | S8 | S9 | S10 | S11 | S12 |
|---|---|---|---|---|---|---|---|---|---|---|---|---|
| | a-a' | b-b'/b-b'' | c-c' | d-d' | e-e' | f-f' | g-g' | h-h' | i-i' | j-j' | k-k' | l-l' |
| switch state | closed | b-b'' closed | closed | open | closed | closed | open | open | open | closed | open | open |

Fig. 8B

CONFIGURABLE WIDEBAND SPLIT LNA

CROSS-REFERENCE TO RELATED APPLICATIONS

The present application is related to US Application No. U.S. Ser. No. 15/342,016 filed Nov. 2, 2016, entitled "Source Switched Split LNA" (now U.S. Pat. No. 9,973,149 issued May 15, 2018) incorporated herein by reference in its entirety. The present application may be related to U.S. application Ser. No. 16/242,870 entitled "5G NR Configurable Wideband RF Front-End LNA" and filed on even date herewith, which is incorporated herein by reference in its entirety.

BACKGROUND

(1) Technical Field

The present disclosure is related to low noise amplifiers (LNAs), and more particularly, to methods and apparatus for designing wideband split LNAs.

(2) Background

The exponential growth of mobile data and emergence of new standards presents significant challenges to radio frequency (RF) receiver front-end design and architecture. FIG. 1 shows some examples of frequency band specifications including ultra high bands (UHB) as defined by the 5G new radio (NR) standard. Such bands cover a wide range of frequencies. More in particular, reference may be made to band n77 as shown in FIG. 1, covering a frequency range of 900 MHz from 3.2 to 4.1 GHz. For comparison purpose, the relatively wide 4G long-term evolution (LTE) band B41 covers from 2.5 GHz to 2.69 GHz and the existing UHB LTE bands B42 and B43 cover around 200 MHz. Based on newer wireless communication standards, the RF receiver front-end design is facing the challenge of meeting conflicting and demanding requirements imposed on performance metrics such as data rate, gain, gain flatness, linearity, noise figure (NF) and receiver sensitivity, power consumption etc. In addition to meeting the mentioned requirements, such designs are expected to be cost effective with small footprints. Added to this challenge is backward compatibility. In other words, and as an example, systems designed to accommodate wideband, will still need to be compatible with older narrow band requirements.

An additional challenge is the ability to handle the variable signal strength received at wireless RF receiver front-ends, which typically have a wide dynamic range. This is because the signal strength depends on how far or close the receiver is from the nearest base station. In order to accommodate such large dynamic ranges, LNAs are typically designed with adjustable gains or various gain modes.

Historically, in order to meet the conflicting and stringent requirements as described above, circuits and systems have been designed with several switches, filters and LNAs. In such circuits, separate sets of LNAs, switches and filters would be dedicated, for example, to different subsets of the frequency bands to be supported. While such approach may be workable, it comes with the significant drawbacks such as area, component count and cost-effectiveness. For example, a design using several LNAs requires significant allocation of area on the integrated circuit (IC) on which the LNAs are fabricated. The cost of the IC is proportional to the size of the IC (i.e., the amount of "real estate" required). Therefore, relying on several narrowband LNAs significantly increases the overall size and cost of the IC.

Description of Concepts and Terminologies Used Throughout the Disclosure

In what follows, some of the concepts later adopted by the methods and devices presented in the disclosure are defined and described. Some relevant performance tradeoffs highlighting implications of designing for stringent/conflicting requirements when designing RF receiver front-ends are also discussed. Exemplary prior art architectures are also described to further illustrate the shortcomings of existing solutions to the challenges encountered when designing for high performance wideband RF receiver front-ends.

Throughout the present disclosure, the term "intra-band non-contiguous" will be used to describe carrier aggregation combinations where the component carriers belong to the same operating frequency band, but have a gap, or gaps, in between. In other words, this carrier aggregation scheme combines channels in the same frequency band that are not next to each other.

A typical RF receiver front-end includes one or more receive chains including an LNA followed by a down-conversion block which essentially includes a local oscillator combined with low pass filtering. Each such receive chain performs a separate down-conversion which essentially involves a local oscillator combined with low-pass filtering. Throughout the present disclosure the term "single-mode" will be used to describe the case where a receiver LNA is connected only with one down-conversion block. This is in contrast with the term "split-mode" which will be used throughout the present disclosure to describe the cases where a receiver LNA is connected with two or more down-conversion blocks.

Throughout the present disclosure, the term "source follower" will be used to describe one of the basic single-stage field effect transistor (FET) amplifier topologies, typically used as a voltage buffer. In this circuit, the gate terminal of the transistor serves as the input, the source is the output, and the drain is common to both (input and output). In such circuit, the output impedance as seen from the source of the FET, is equal to $$\frac{1}{g_m}$$

where $g_m$ represents the transconductance of the FET device. The source follower configuration is known essentially to be an impedance transformer, providing improved and substantially frequency independent output matching. This is the reason why the source follower is a suitable architecture to be used for wideband applications.

As known in the art, in RF systems bandwidth is sometimes defined in terms of percentage bandwidth, which is defined as the ratio (in percentage) of the absolute bandwidth to the highest frequency at which such RF systems operate. One performance metrics of RF amplifier associated with the bandwidth is represented by gain flatness over the specified bandwidth. Gain bandwidth is typically specified in dB, indicating the gain variation over the frequency range of operation. Throughout the disclosure the terms:

"Narrowband" will be used to describe applications where the frequency range of operation represents a percentage bandwidth of less than 7.5%. An example for such a case is band 42 of the Long-Term Evolution (LTE) standard;

"Extended Narrowband" will be used to describe applications where the frequency range of operation represents a percentage bandwidth between 7.5% and 15%. An example for such a case is the band NR79 of the 5G new radio (NR) standard; and "Wideband" will be used to describe applications where the frequency range of operation represents a percentage bandwidth of less between 15% and 25%. An example for such a case is the band NR77 of the 5G new radio (NR) standard.

In view of the design challenges described in the previous section, input and output matching (represented by the $S_{11}$ and $S_{22}$ parameters) and gain flatness across the bandwidth are among the key performance metrics while maintaining lowest NF, high gain and linearity. Additionally, lower gain modes requiring higher linearity are also highly desired. Lower power consumption may be achieved when operating in lower gain modes.

Throughout the present disclosure, the term "de-Qing" will be used to describe design techniques where the quality factor (Q) of a circuit is lowered to improve some other performance metrics. As an example, in a typical LNA architecture, de-Qing of the load may be exercised to achieve a desired gain flatness over a wider band at the expense of reducing the gain. De-Qing an LC network is typically performed by increasing the resistance of such network resulting in a lower gain. The same concept could be applied to the input of a typical LNA architecture whereby a wider input match can be achieved by reducing the quality factor of the input matching network, at the expense of NF and gain.

For wideband applications, various approaches may be adopted to design for wider output matching:

De-Qing: as described above, such technique resulting in lower gain;

Designing a multi-stage passive output match which would offer higher bandwidth. However, this approach will require high Q inductors; and A source follower topology, which may be used without sacrificing gain while achieving an improved linearity. However, this may not be an ideal solution on its own, when a lower gain and therefore a lower power consumption is required.

As for the receiver front-end input, a wider input match is typically achieved using a resistive negative feedback network, which may offer better tradeoffs among NF, gain and S11 bandwidth. In what follows, and in order to further clarify the various above-mentioned techniques and associated tradeoffs, typical prior art LNA architectures are described.

FIG. 2A shows a prior art RF receiver front-end (200A). The RF receiver front-end (200A) comprises amplifying cascode transistors (T1, T2), an input match circuit (201) and output match network (202). The input match network (201) comprises an input inductor (L1) and a degenerative inductance (L2) ( ). The output match network (202) comprises inductor (Ld), resistor (Rd) and capacitor ($C_{match}$). As described before, resistor (Rd) is used for de-Qing the output match network (202) to address wideband requirements. However, this will result in a lower gain impacting the overall system performance of the receiver implementing such front-end architecture. At the input, de-Qing may be performed by resizing transistor (T1) which may adjust NF and gain.

FIG. 2B shows a prior art RF receiver front-end (200B) which has a better performance in wideband applications compared to the RF receiver front-end (200A) of FIG. 2A. The RF receiver front-end (200B) comprises a feedback resistor (Rf), switched in by closing switch (S1), and used to provide wider band operation. Output matching is now achieved using a source follower circuit (201) including transistor (T3) and inductor ($L_{SF}$). As described previously, the output impedance of the source follower is equal to $$\frac{1}{g_m}$$

where $g_m$ represents the transconductance of transistor (T3). Such transconductance is practically frequency independent offering improved output matching for wideband applications.

FIG. 2C also shows a prior art RF receiver front-end (200C) using multi-stage output matching to meet extended narrowband requirements (as defined above). The RF receiver front-end (200C) comprises a multi-stage output matching network (203) having multiple reactive elements ($L_1$, $L_2$, $L_d$, $L_4$, $C_1$, $C_2$, $C_3$). The output matching network (203) is essentially a higher order filter with multiple poles providing more flexibility to design for wider bands. However, this architecture has the drawback of being bulky and requires a larger area to be implemented.

FIG. 2D shows a comparison table (200D) summarizing qualitatively the overall performances of the architectures shown in FIGS. 2A-2C when used in wideband applications. Gain flatness, area, linearity and current consumption requirements in a typical wideband application are shown for comparison purpose, together with the performance of each architecture, as assessed based on such requirements.

With reference to FIGS. 2A-2C, none of the architectures shown offer multiple gain modes. Each architecture uses specific approaches to address specific requirements by trading off other system performance metrics.

In view of the above, cost-effective RF receiver front-end designs using a minimum number of electronic elements and thus offering small footprint, while meeting the above-mentioned stringent and conflicting requirements related to performance metrics such as gain, gain flatness, gain modes, NF, linearity, multiple frequency bands, wide received signal dynamic range and power consumption are highly desired.

In view of the above, cost-effective RF receiver front-end designs using a minimum number of electronic elements and thus offering small footprint, while meeting the above-mentioned stringent and conflicting requirements related to performance metrics such as gain, gain flatness, gain modes, NF, linearity, multiple frequency bands, wide received signal dynamic range and power consumption are highly desired. Methods and devices described in the present disclosure address such need and provide solutions to the technical problems outlines above.

In RF wireless applications, it is common today for receivers in a transceiver, such as a cellular telephone, to have the capability to concurrently receive signals transmitted over multiple supported frequency ranges. The signals within each supported frequency range are combined (or "aggregated") to be transmitted together at the same time to the receiver. Carrier aggregation represents yet another existing challenge to the design of today's RF receiver front-ends. Referring back to FIG. 1, and when designing such RF receiver front-ends, carrier aggregation may translate into dual connectivity which can be defined, by way of example, such that a device may operate on 4G LTE and 5G NR bands simultaneously. With further reference to FIG. 1, since channel B42 is contained within the bands n77 and n78 frequency ranges, the corresponding carrier aggregation schemes are similar to intra-band non-contiguous case and may be handled in the front-end module.

In a carrier aggregation scenario, and for performance optimization purposes, it is desirable to send each supported frequency range through a separate receive chain optimized for the frequency of the supported frequency range. Each such receive chain performs a separate down-conversion which essentially involves a local oscillator combined with low-pass filtering. This is highly desired more in particular for the case of non-contiguous bands where there might be large gaps in-between the bands.

Historically, the solutions to such design challenges have been to design multiple separate RF front ends consisting of antennas, filters, and LNAs to handle each chain and similar to what was previously described, such solutions are non-optimal and are almost prohibitive as they require larger physical space to be implemented, which means more form-factor restrictions and higher cost.

FIG. 2E shows a receiver font-end (200E) according to the teachings of the above-incorporated application. The RF receiver front-end (200E) comprises two LNAs (205, 206). Switches (S1, .... S4) are used to choose either one or both of the LNAs (205, 206). In other words, the RF receiver front-end (200E) may operate either in single-mode or split-mode. Although the architecture shown in FIG. 2E is a solution to the carrier aggregation described above, it may still not fully satisfy the stringent and conflicting requirements such as the high frequency and wideband as described through this section. This is mainly due to capacitive loading at the input and the required bandwidth of the input and output matching. In such split architecture, and for output isolation purpose, the split is performed at the input of the LNAs. This may result in a degradation of the NF performance. New designs are therefore desired to support the wide bandwidth and higher frequency of the NR standard while addressing the carrier aggregation requirements.

Methods and devices described in the present disclosure address design challenges and needs as described throughout this section and provide solution to the problem while accommodating, at the same time, carrier aggregation requirements as imposed, for example, by recent standards such as 5G NR.

SUMMARY

According to a first aspect of the present disclosure, a Radio Frequency (RF) receiver front-end is provided, comprising: an input and a plurality of outputs; a reconfigurable low noise amplifier (LNA) block having an input matching network, and a plurality of electronic elements each having an electronic element output; an output matching network having a plurality of output matching elements; and a switching network; wherein: each output matching element of the plurality of output matching elements is connected with a corresponding output of the plurality of outputs; the switching network is connected to the input matching network, the LNA block and the output matching network; during a first mode of operation: i) in a first configuration, switches of the switching network: enable a single electronic element of the plurality of electronic elements and a corresponding output matching element; and disable remaining electronic elements of the plurality of electronic elements and corresponding output matching elements; ii) the RF receiver front-end is configured to receive an input signal at the input and generate a corresponding output signal at an output of the plurality of outputs, and during a second mode of operation: i) in a second configuration, the switches of the plurality of switches enable two or more electronic elements of the plurality of electronic elements and corresponding output matching elements of the plurality of output matching elements; and ii) the RF receiver front-end is configured to receive the input signal at the input and generate two or more corresponding output signals at two or more outputs of the plurality of outputs.

According to a second aspect of the present disclosure, a Radio Frequency (RF) receiver front-end is provided, comprising: a plurality of inputs and a plurality of outputs; a reconfigurable low noise amplifier (LNA) block having an input matching network, a plurality of electronic elements; an output matching network having a plurality of output matching elements; and a switching network; wherein: the input matching network comprises a plurality of input matching elements connected with corresponding inputs; each output matching element of the plurality of output matching elements is connected with a corresponding output of the plurality of outputs; the switching network is connected to the input matching network, the LNA block and the output matching network; and the switching network is to: configure or reconfigure the plurality of input matching elements to receive one or more input signals from the plurality of inputs; and configure or reconfigure the plurality of electronic elements and corresponding output matching elements to generate two or more output signals at two or more outputs.

According to a third aspect of the present disclosure, a method of amplifying an input signal received at an RF receiver front-end is disclosed, providing: providing and input and a plurality of outputs; providing an LNA block with an input matching network and a plurality of electronic elements; providing an output matching network with a plurality of output matching elements; connecting each output matching element of the plurality of output matching elements with a corresponding output of the plurality of outputs; providing a switching network connected with the LNA block, the input matching network and the output marching network; during a first mode of operation, configuring switches of the switching network in order to: enable a single electronic element of the plurality of electronic elements and corresponding output matching elements; disable remaining electronic elements of the plurality of electronic elements and corresponding output matching elements; and receive an input signal at the input and generate a corresponding output signal at an output of the plurality of outputs; during a second mode of operation, configuring the switches of the switching network in order to: enable two or more electronic elements of the plurality of electronic elements and corresponding output matching elements; and receive the input signal at the input and generate two or more corresponding output signals at two or more outputs of the plurality of outputs.

Further aspects of the disclosure are provided in the description, drawings and claims of the present application.

DESCRIPTION OF THE DRAWINGS

FIG. 2D shows a comparison table summarizing the overall performances of the architectures shown in FIGS. 2A-2C when used in wideband applications.

FIGS. 5B, 6B, 7B and 8B shows tables representing switch states according to embodiments of the present disclosure.

DETAILED DESCRIPTION

Throughout the present disclosure, the term "node" will be used to describe any point on a circuit where connections of two or more circuit elements meet or are adapted to meet. Although nodes will be graphically represented by points in the present disclosure, the person skilled in the art will understand that a node may also present part of a line or connection between elements or circuital devices, not just a single point.

Figure 3:
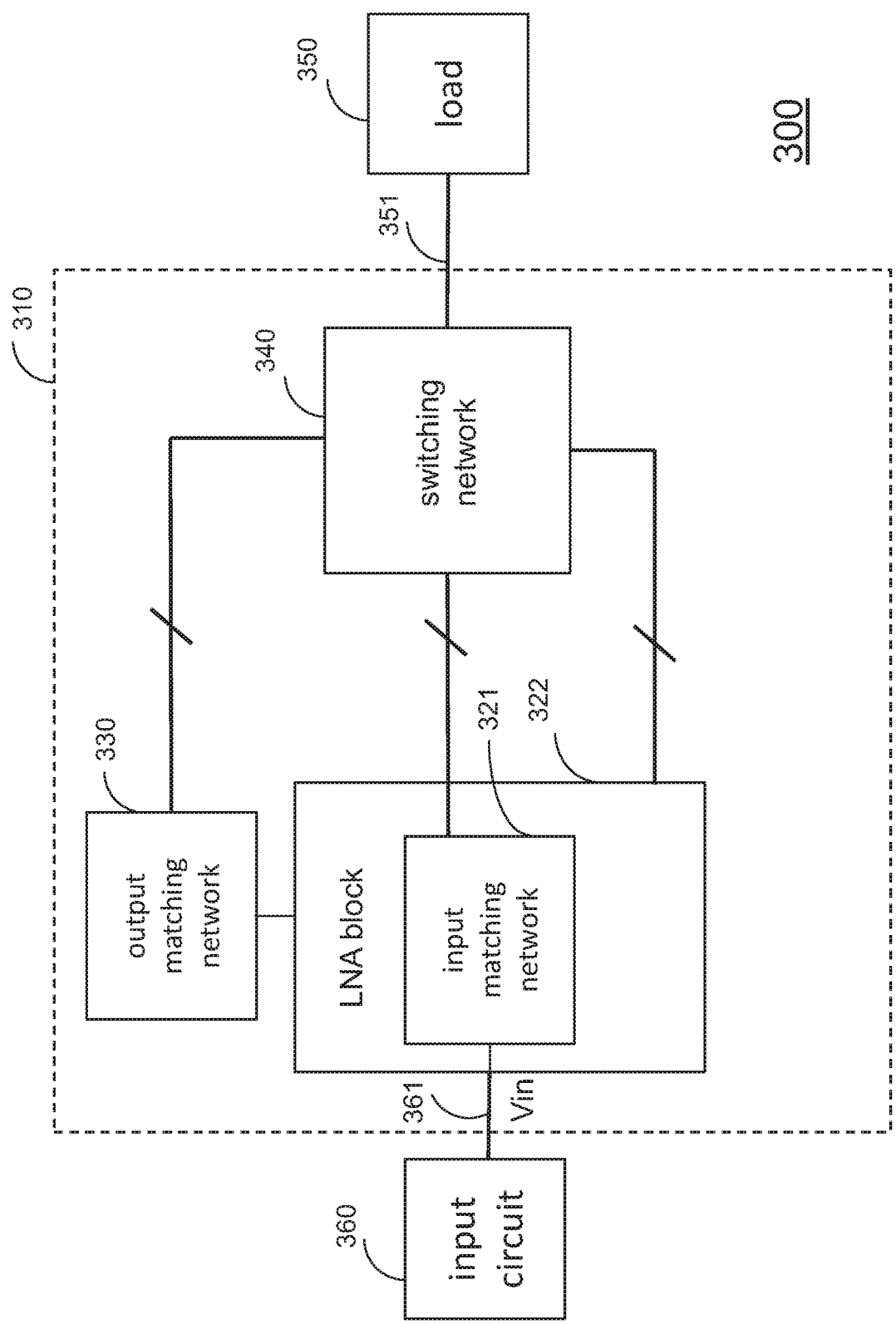
FIG. 3 shows an electronic circuit according to an embodiment of the present disclosure.

FIG. 3 shows an electronic circuit (300) according to an embodiment of the present disclosure. The electronic circuit (300) comprises an RF receiver front-end (310) connectable to an input circuit (360) at the RF receiver front-end input (361) and to a load (350) at the RF receiver front-end output (351). The RF receiver front-end (310) comprises and LNA block (322), an output matching network (330) and a switching network (340). The LNA block (322) comprises an input matching network (321). The switching network (340) is connected to the output matching network (330), the LNA block (322) and the input matching network (321). The RF receiver front-end (310) is configured to receive an input signal (Vin) from the input circuit (360) at the RF receiver front-end input (361) and to generate a corresponding output signal at the RF receiver front-end output (351), across load (350).

With reference to FIG. 3, the switching network (340) comprises one or more switches used to configure/reconfigure the RF receiver front-end (310) to meet different and possibly conflicting requirements imposed by various applications. In other words, by turning a subset of such switches on or off, certain electronic elements that are constituents of the input matching network (321), LNA block (322), and/or output matching network (330) may be switched in and out of a signal path from the RF receiver front-end input (361) to RF receiver front-end output (351), such that the RF receiver front-end (310) is adapted to meet certain design requirements. By way of example, and not of limitation, the RF receiver front-end (310) may be used in a first application where saving power is of highest importance. In such application, the RF receiver front-end (310) may be configured to possibly switch to lower gains more often so that the overall power consumption requirements are met. This is in contrast with a second exemplary application where a signal having the highest possible strength is highly desired. In this scenario, the RF receiver front-end (310) may be configured to accommodate the highest data rate providing signal with the highest fidelity. In order to do so and compared to the first application, a different set of switches may be turned on or off thereby switching in and out different electronic elements so the requirements imposed by the second application are met. The person skilled in the art will appreciate that the methods and devices designed in accordance with teachings of the present disclosure allow for a higher flexibility to accommodate applications imposing completely different requirements using practically the same design. In what follows, exemplary embodiments of the present disclosure will be described to further clarify such concept.

Figure 4A:
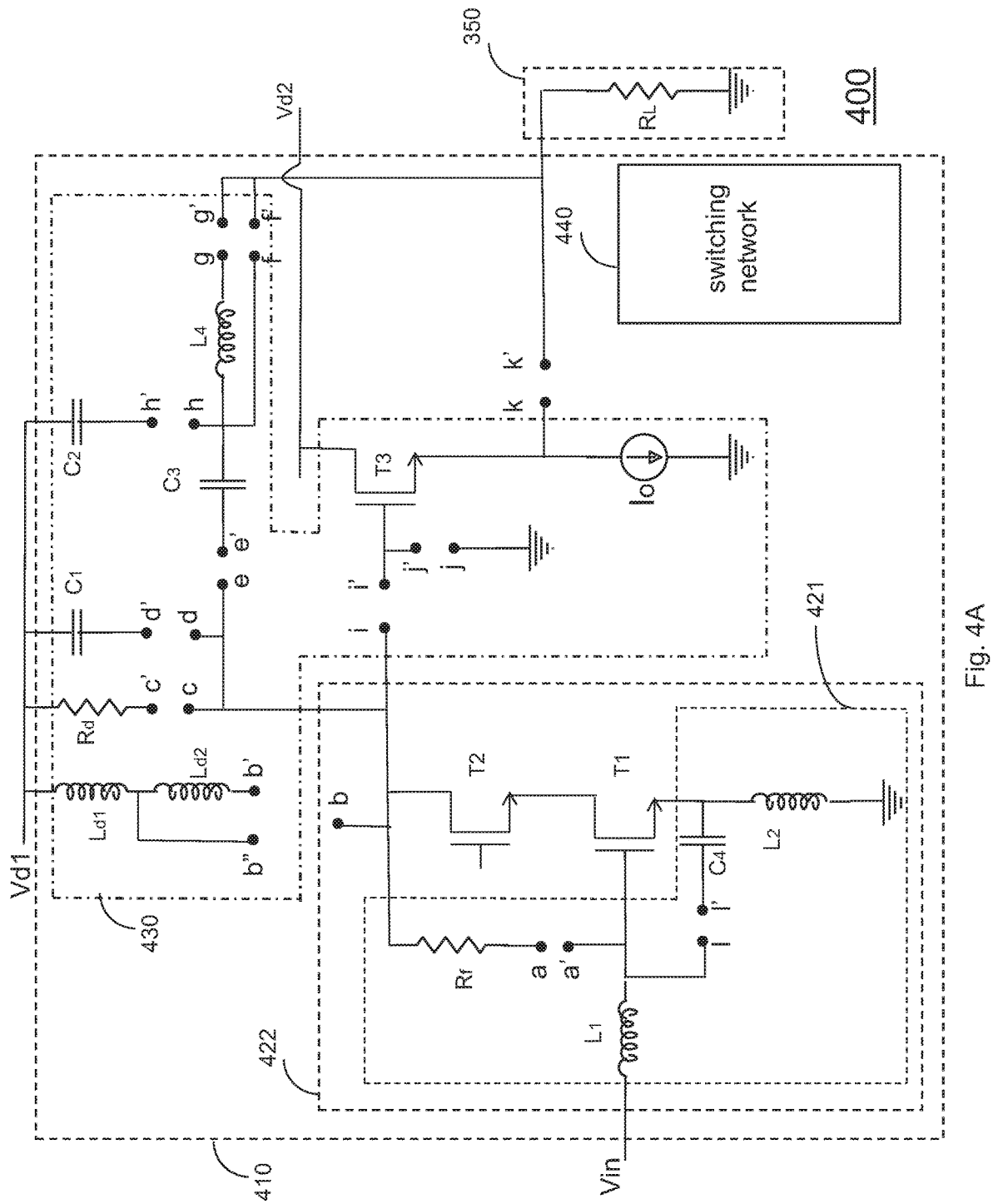
FIG. 4A shows another electronic circuit according to an embodiment of the present disclosure.

FIG. 4A shows an electronic circuit (400A) in accordance with an embodiment of the present disclosure. The electronic circuit (400A) comprises output matching network (430) and an LNA block (422) including an input matching network (421). The RF receiver front-end (410) is an exemplary implementation of the RF receiver front-end (310) of FIG. 3. In other words, input matching network (421), LNA block (422) and output matching network (430) are exemplary implementations of their counterparts, input matching network (321), LNA block (322) and output matching network (330) of FIG. 3, respectively. The RF receiver front-end (410) is connectable to the load (350). Connections of the switching network (440) to the rest of the circuit are not shown for the sake of simplicity. As shown in FIG. 4A, RF receiver front-end (410) comprises several connection points that are represented by nodes (a, a1, b, b', b", c, c1, . . . l, l'). Nodes represented with same alphabetic letter in their name correspond to each other. For example, nodes (a, a') may be connected to each other using a switch. As a further example, node (b) may be connected to node (b') or (b") depending on the position of a corresponding single-pole double-throw switch. As will be explained in what follows, switches used for such purpose may be constituents of the switching network (340). The switching network may be configured differently to serve different applications with various and sometimes conflicting requirements.

With reference to FIG. 4A:

feedback resistor ($R_f$) may be switched in and out by connecting and disconnecting nodes (a, a') respectively. The feedback resistor ($R_f$) may be switched in to provide a wider band input matching. According to embodiments of the present disclosure, the feedback resistor ($R_f$) may be part of a feedback network comprising resistors and reactive elements such as inductors and/or capacitors.

Depending on the required output matching, a larger or smaller inductor can be used by connecting node (b) to node (b') or node (b") respectively. In accordance with further embodiments of the present disclosure, any or a combination of inductors ($L_{d1}, L_{d2}$) may be replaced by a variable inductor.

Transistor (T3) may be switched in/out by connecting/disconnecting nodes (i, i') respectively. When transistor (T3) is switched in, a combination of such transistor and current source ($I_O$) provide a source follower configuration. As mentioned previously, such configuration is used when a wider band output matching is desired while minimizing impact on gain and linearity. In narrower band application where transistor (T3) may not be required, the gate of transistor (T3) is connected to ground by connecting nodes (j, j') to minimize power consumption.

As mentioned previously, for wideband applications, resistor (Rd) may be switched in by connecting nodes (c, c'). As a result, wider band output matching is achieved at the expense of the gain.

A combination of capacitors (C1, C2, C3) and inductor (L4) or a subset thereof may be switched in to achieve wideband operation using only passive elements. This represents essentially a multi-stage passive output matching network.

Nodes (l, l') can be connected/disconnected to achieve narrow/wide band input matching. When nodes (l, l') are connected, a combination of capacitance (C3) and gate-source capacitance ($C_{gs}$) of transistor (T3) with inductances (L1, L2) and feedback resistor ($R_f$) forms the input matching network (421). Therefore, switching feedback resistor ($R_f$) and/or capacitor (C4) provides two different mechanisms to provide wider or narrow band input matching depending on desired requirements.

RF receiver front-end (410) may be configured to receive voltages ($V_{d1}$, $V_{d2}$) for biasing purposes.

Figure 4B:
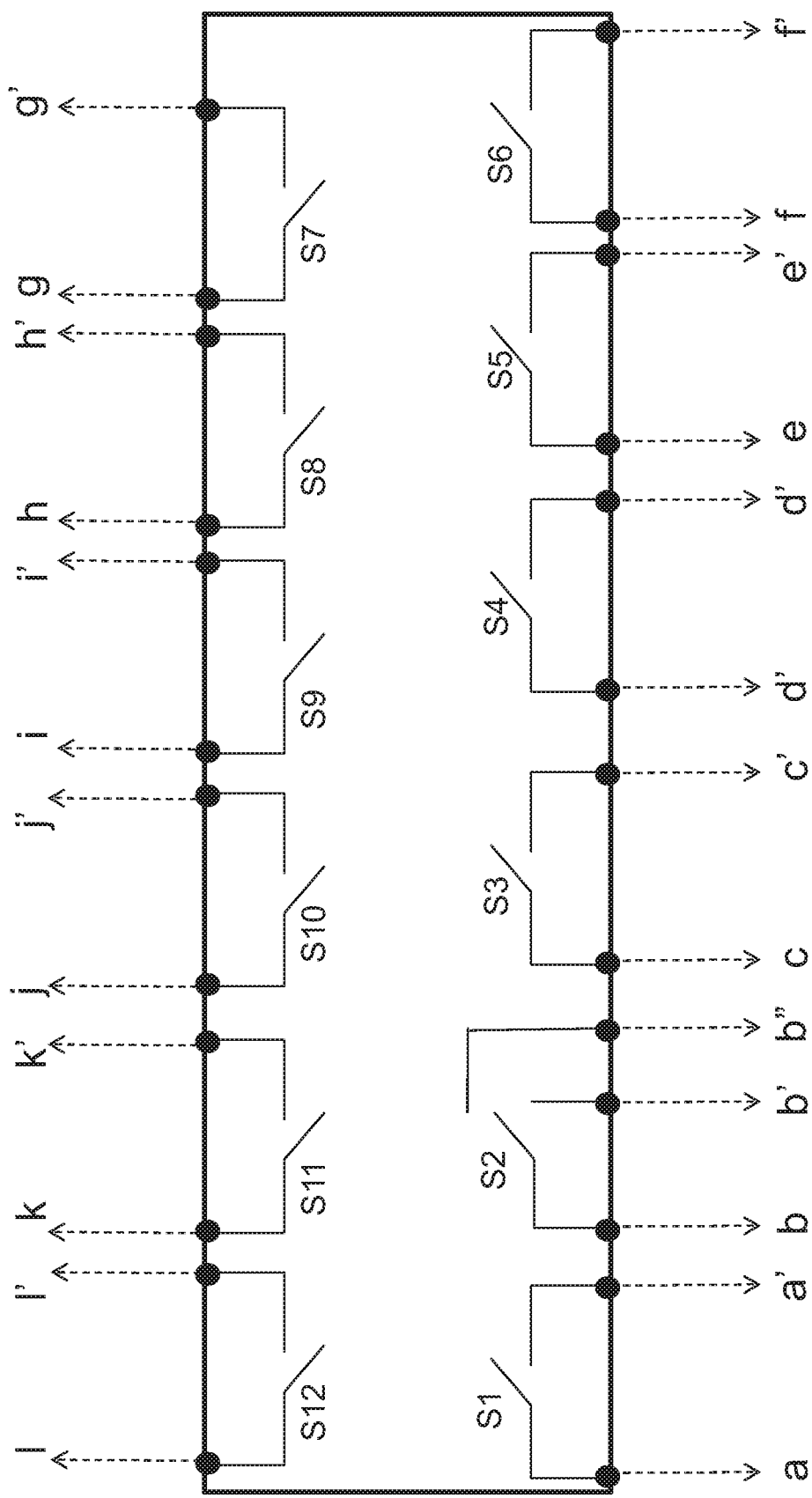
FIG. 4B shows a switching network according to embodiments of the present disclosure.

FIG. 4B shows a switching network (440) in accordance with embodiments of the present disclosure. Switching network (440) represents an exemplary implementation of the switching network (340) of FIGS. 3 and 4A, comprising one or more switches (S1, . . . , S12). Switching network (440) further comprises several nodes shown in black dots connecting to various corresponding nodes of the electronic circuit (400A). Connections of the nodes of the switching network (440) to corresponding nodes of the electronic circuit (400A) are shown with dotted arrows. Referring to FIGS. 4A-4B, and as an example, switch (S1) may connect or disconnect nodes (a, a1), switch (S2) may connect or disconnect nodes (b, b') or (b'b''), switch (S3) may connect or disconnect nodes (c, c') and so on. As mentioned previously, the configuration of switches (S1, . . . , S12) depends on the application and therefore the desired set of requirements that are to be met. According to the embodiment of the present disclosure, the configuration of switches (S1, . . . , S12) may change during operation of the circuit.

Figure 5A:
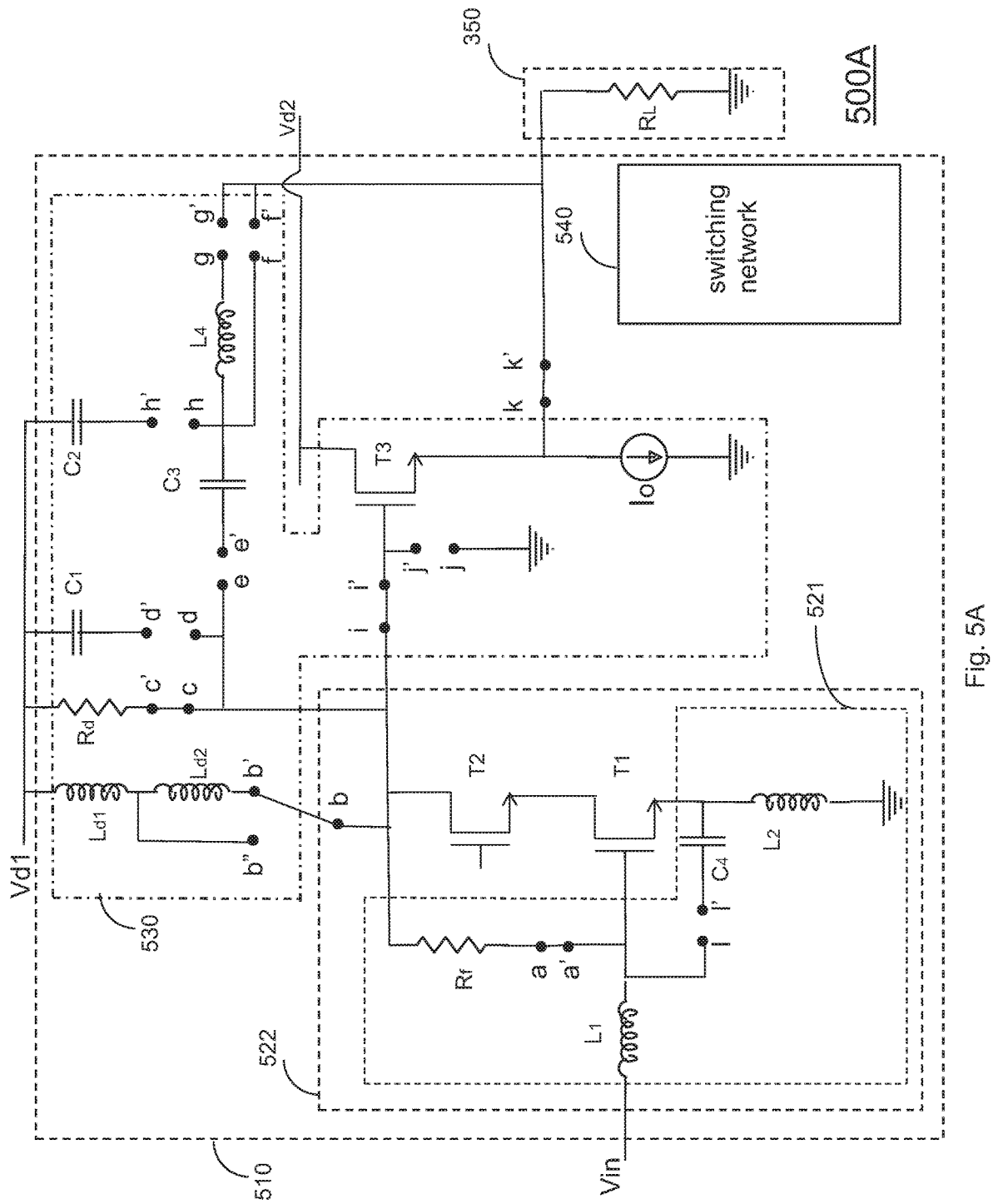
FIGS. 5A, 6A, 7A, 8A and 9 show various electronic circuits in accordance with embodiments of the present disclosure.

In accordance with embodiments of the present disclosure, FIG. 5A shows an electronic circuit (500A) comprising an RF receiver front-end (510) which is the RF receiver front-end (410) of FIG. 4A configured according to what is shown in switching configuration table (500B) of FIG. 5B. As shown in switching configuration table (500B), switches (S1, . . . , S12) of switching network (540) are mentioned in a top row, with a bottom row showing states of the switches and a middle row showing switch node IDs. In other words, input matching network (521), LNA block (522) and output matching network (530) represent their respective counterparts (421, 422, 430) of FIG. 4A, each configured according to table (500B) of FIG. 5B. In view of what described previously throughout the disclosure, the RF receiver front-end (510) is configured to meet wideband requirements using a source follower configuration providing best gain flatness across wideband and using larger inductance (series combination of $L_{d1}$ and $L_{d2}$).

Figure 1:
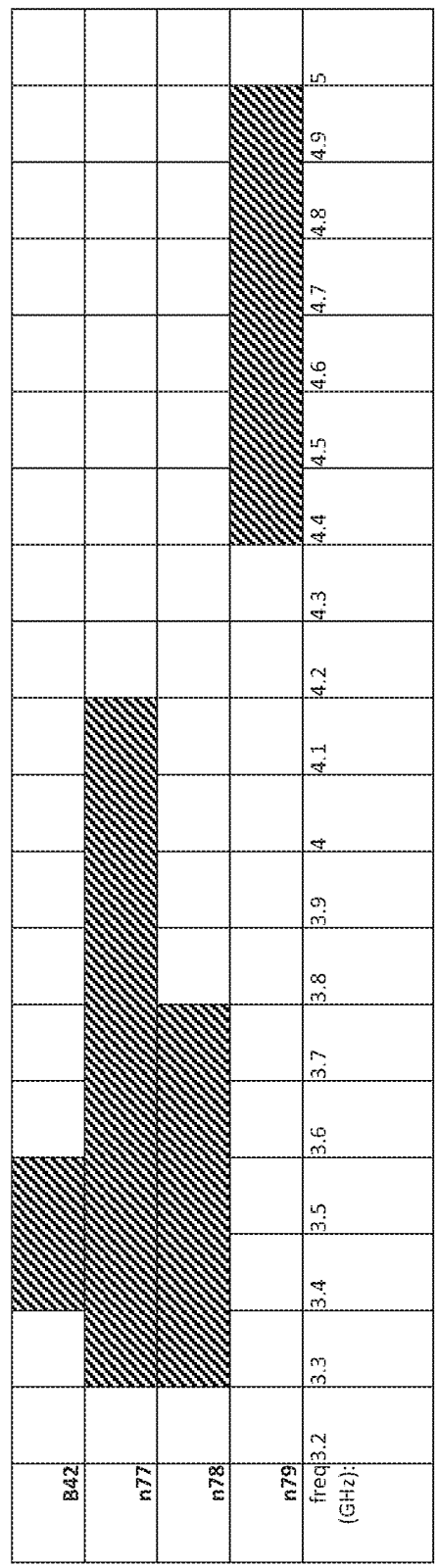
FIG. 1 shows some examples of frequency band specifications as defined by the 5G new radio (NR) standard.
Figure 2A:
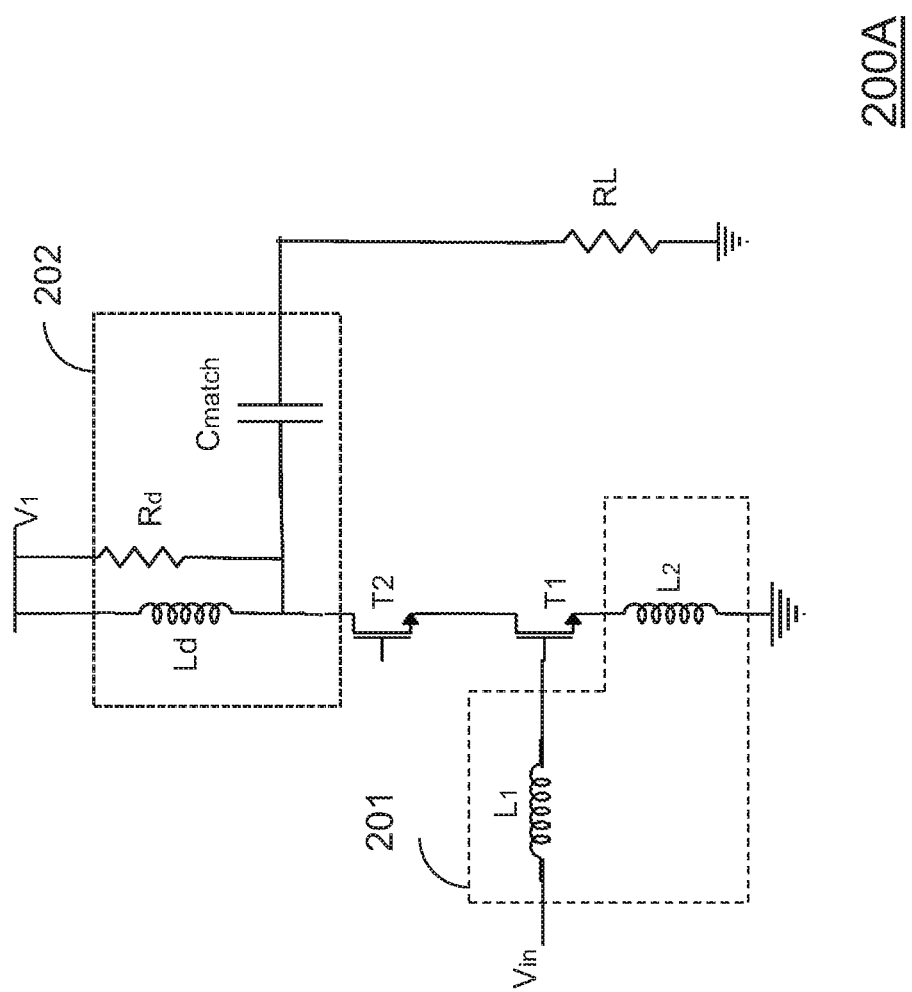
FIG. 2A shows prior art RF receiver front-end which is more suitable for narrow-band applications.
Figure 2B:
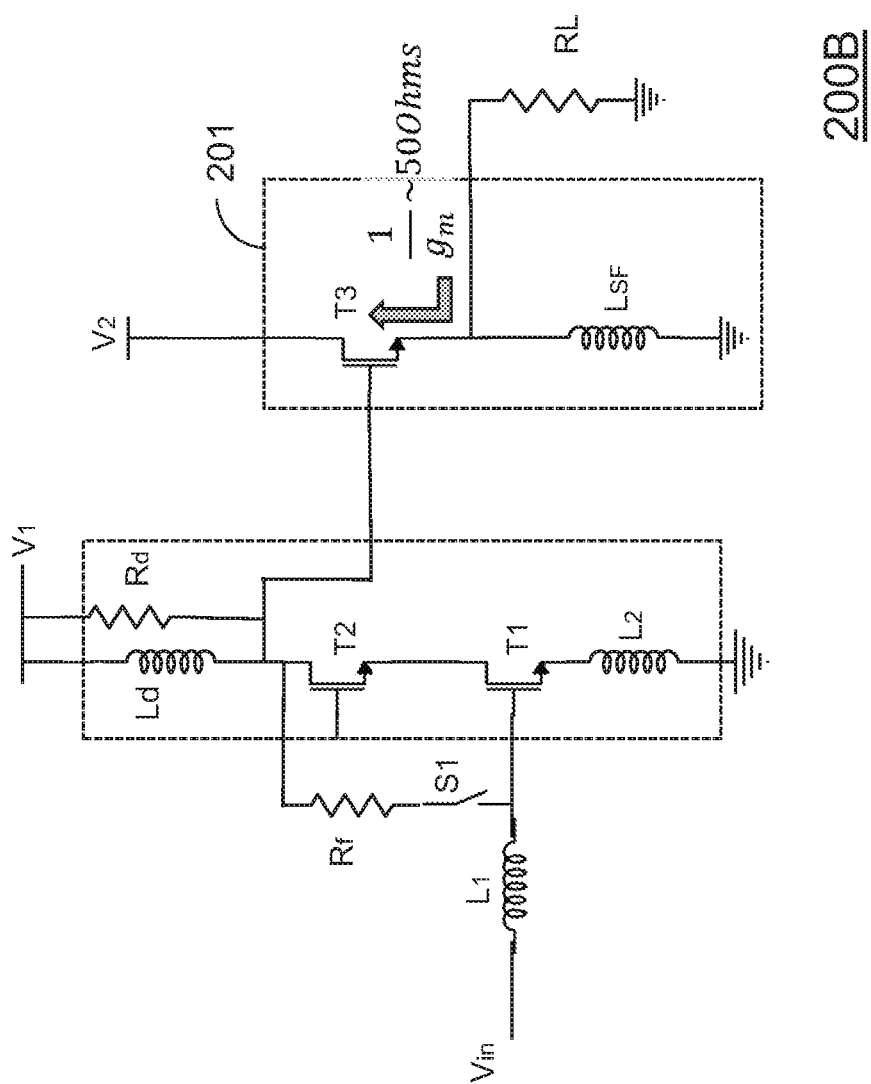
FIG. 2B shows another prior art RF receiver front-end architecture.
Figure 2C:
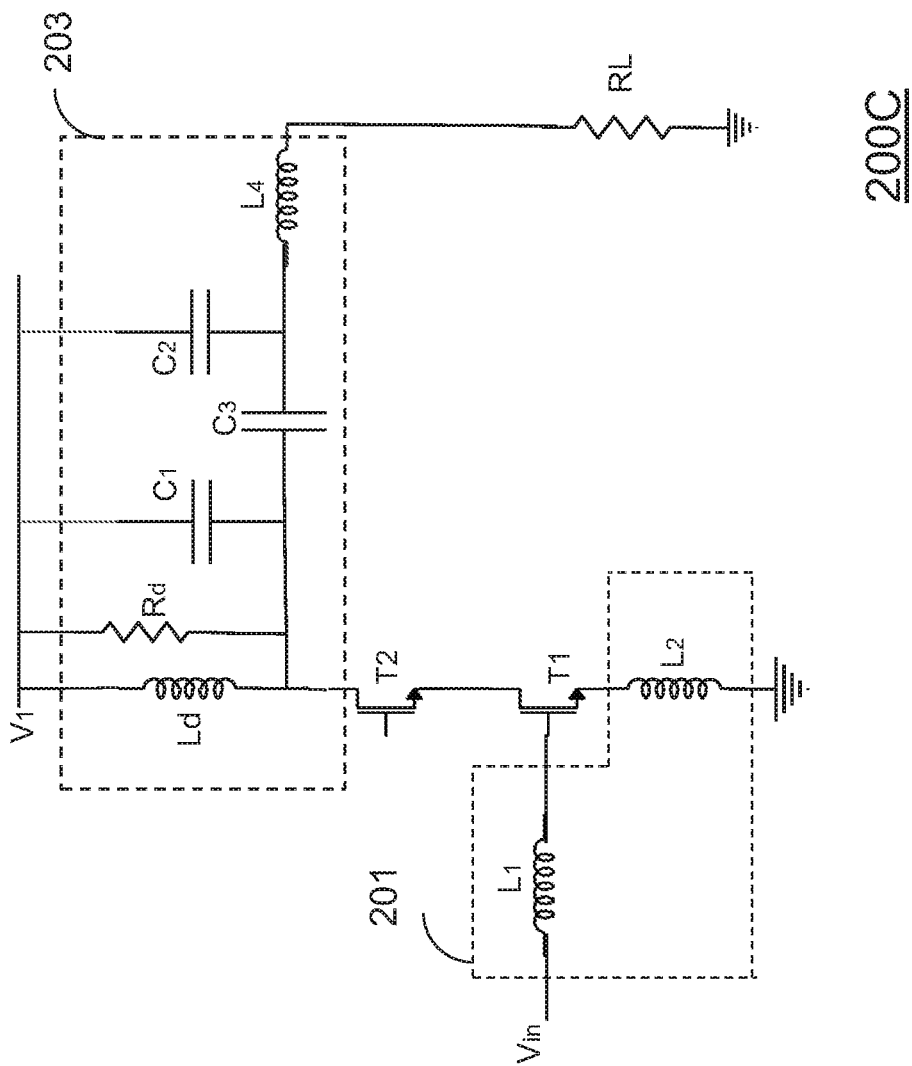
FIG. 2C shows a prior art RF receiver front-end using multi-stage output matching.
Figure 6A:
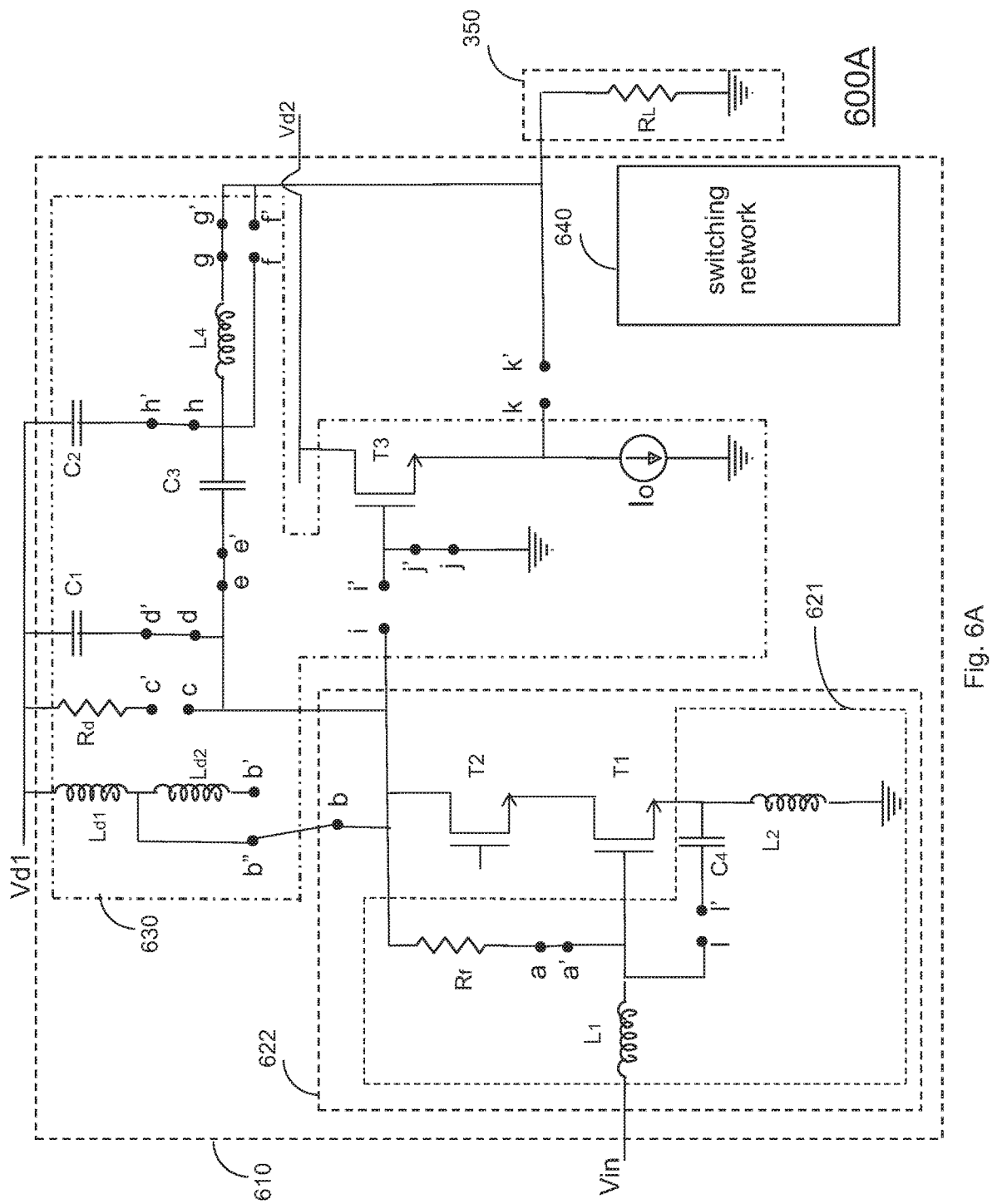

In accordance with further embodiments of the present disclosure, FIG. 6A shows an electronic circuit (600A) comprising an RF receiver front-end (610) which is the RF receiver front-end (410) of FIG. 4A configured according to what is shown in switching configuration table (600B) of FIG. 6B. As shown in switching configuration table (600B), switches (S1, . . . , S12) of switching network (640) are mentioned in a top row with a bottom row showing states of the switches and a middle row showing switch node IDs. In other words, input matching network (621), LNA block (622) and output matching network (630) represent their respective counterparts (421, 422, 430) of FIG. 4A, each configured according to table (600B) of FIG. 6B. In contrast with the RF receiver front-end (510) of FIG. 5A, in RF frond-end (610), the source follower is switched out (nodes i and i' are disconnected) and wideband output matching is achieved using passive elements. In other words, a combination of inductors ($L_{d1}$, $L_{d1}+L_{d2}$, $L_4$) and capacitors (C1, C2, C3) provides a multi-pole filter which may be designed to accommodate wider bands according to the desired requirements. Moreover, the gate of transistor (T3) is connected to ground for lower current consumption. Referring back to the comparison table of FIG. 2D and the architectures shown in FIGS. 2B-2C, it can be noticed that RF receiver front-end (510) may provide improved gain flatness and linearity over the RF receiver front-end (610) with a possible increase in power depending on the required performance in other parameters with a flexibility to choose how to optimize.

Figure 7A:
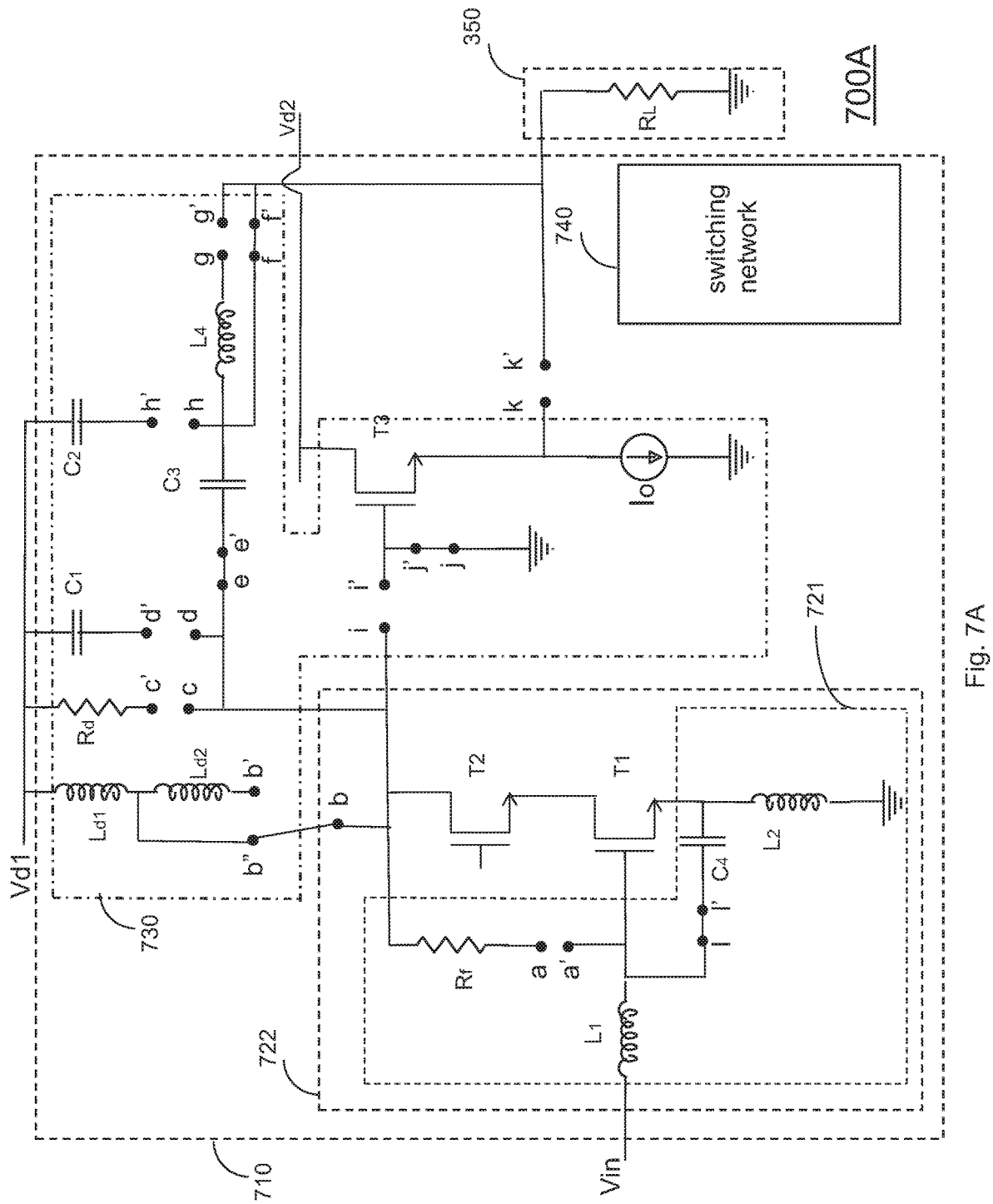

In accordance with other embodiments of the present disclosure, FIG. 7A shows an electronic circuit (700A) comprising an RF receiver front-end (710) which is the RF receiver front-end (410) of FIG. 4A configured according to what is shown in switching configuration table (700B) of FIG. 7B. As shown in switching configuration table (700B), switches (S1, . . . , S12) of switching network (740) are mentioned in a top row with a bottom row showing states of the switches and a middle row showing switch node IDs. In other words, input matching network (721), LNA block (722) and output matching network (730) represent their respective counterparts (421, 422, 430) of FIG. 4A, each configured according to table (700B) of FIG. 7B. In view of what described previously throughout the disclosure, the RF receiver front-end (710) is configured to be used in narrow band application. In such configuration, narrow band output matching is achieved by switching out capacitors (C1, C2), inductor (L4) and transistor (T3). By virtue of using a combination of a smaller inductance (e.g. using only ($L_{d1}$ and switching out $L_{d2}$)) with capacitor (C3) narrow band operation is optimized for a desired band. As for the input matching, feedback resistor ($R_f$) is switched out and the capacitor (C4) is switched in to optimize input matching performance for narrow-band operation.

Figure 8A:
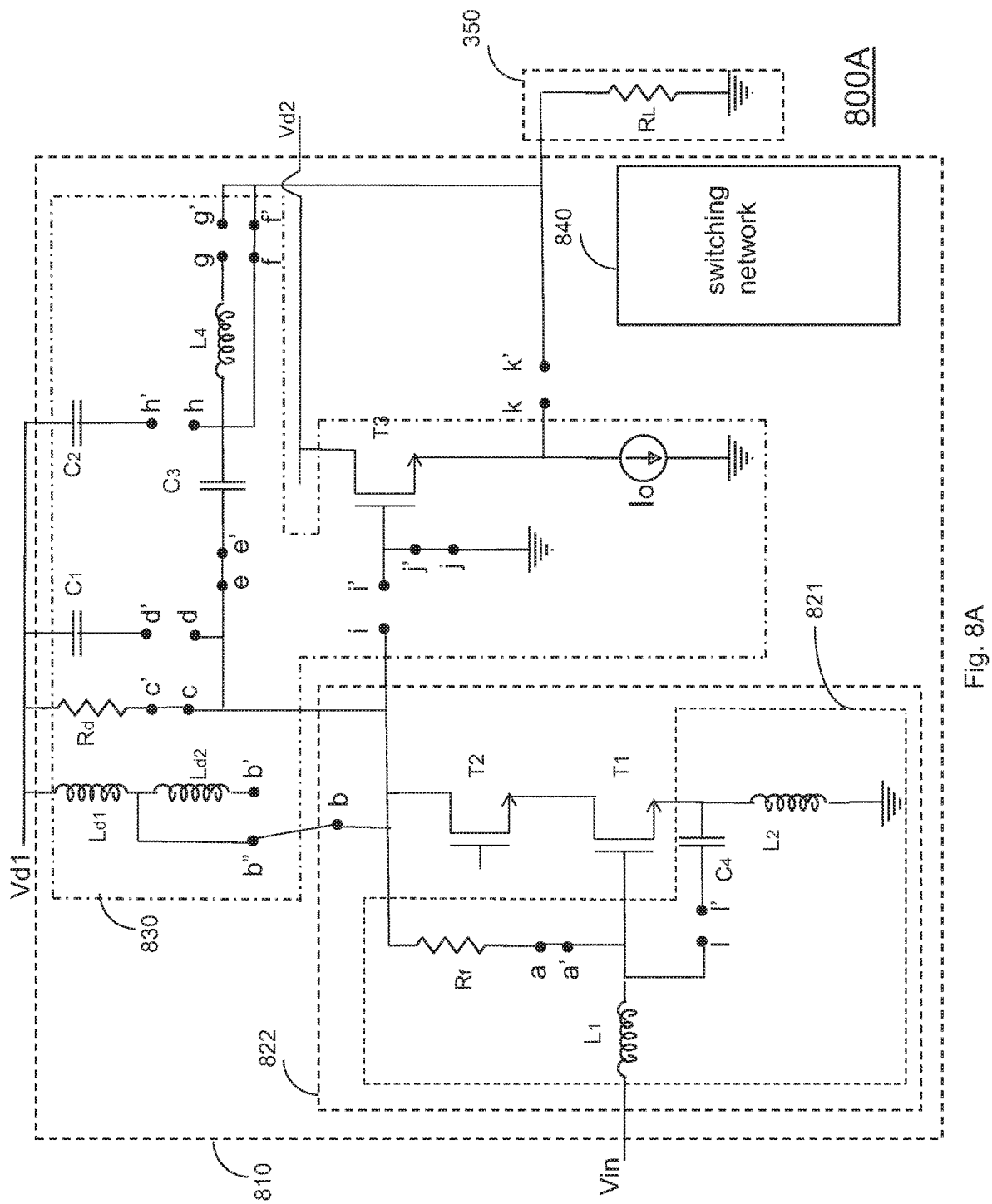

In accordance with yet other embodiments of the present disclosure, FIG. 8A shows an electronic circuit (800A) comprising RF receiver front-end (810) which is the RF receiver front-end (410) of FIG. 4A configured according to what is shown in switching configuration table (800B) of FIG. 8B. As shown in switching configuration table (800B), switches (S1, . . . , S12) of switching network (840) are mentioned in a top row with a bottom row showing states of the switches and a middle row showing switch node IDs. In other words, input matching network (821), LNA block (822) and output matching network (830) represent their respective counterparts (421, 422, 430) of FIG. 4A, each configured according to table (800B) of FIG. 8B. In view of what was described previously throughout the disclosure, the RF receiver front-end (810) is configured to be used in wide band applications but in lower gain mode. In such configuration, wideband output matching is achieved by de-Qing, e.g. switching in resistor (Rd). As discussed previously, this will result in a lower gain. Following the similar mechanism as described before, wideband input matching is obtained by switching the feedback resistor in. With reference to the embodiments shown in FIGS. 4A, 5A, . . . , 8A, one or more passive elements (inductors or capacitors) may be variable to provide further flexibility to meet different requirements.

With further reference to FIGS. 4A-8B, the person skilled in the art will appreciate that, by reconfiguring the same circuit, different requirements imposed by various applications may be met using the teachings of the present disclosure.

Figure 9:
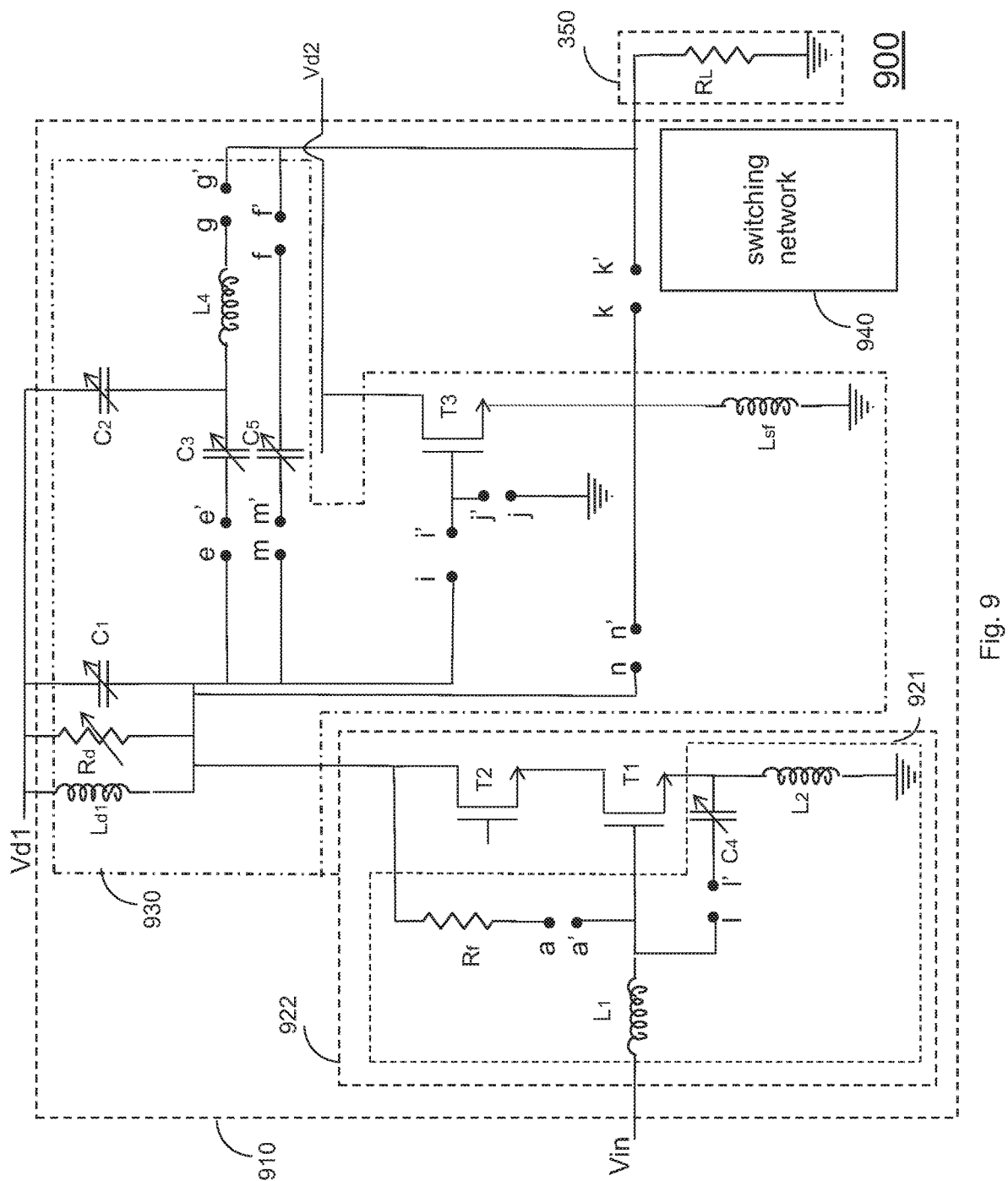

FIG. 9 shows an electronic circuit (900) comprising an RF receiver front-end (910) according to embodiments of the present disclosure. The RF receiver front-end (910) comprises an LNA block (922) including an input matching network (921), and an output matching network (930) that are exemplary implementations of the input matching network (321), the LNA block (322) and an output matching network (330) of FIG. 3. The concepts discussed with regards to embodiments of FIGS. 4A-8A are equally applicable here. In other words, nodes represented with same letters correspond to each other and by connecting or disconnecting corresponding nodes, various elements of the electronic circuit (900) may be switched in or out thereby providing flexibility of adapting to stringent and possibly conflicting requirements imposed by different applications. As shown in FIG. 9, the output matching network (930) comprises variable resistor (Rd) and variable capacitors ($C_1, \ldots, C_5$) to provide additional flexibility when designing such a circuit for different use cases. With reference to FIGS. 4A and 9, it can be noticed that the current source ($I_O$) of FIG. 4A is now replaced by inductance ($L_{sf}$). By way of example, when nodes (n, n') and nodes (k, k') are connected by closing their corresponding switches, inductors ($L_{d1}, L_{sf}$) are effectively parallel to each other, resulting a smaller overall inductance. Such configuration may be used in high performance narrowband application when high quality matching is required to be achieved by using smaller inductances. In such application, single stage LC matching may be achieved by connecting nodes (m, m') and (f, f') to each other by closing corresponding switches. Continuing with the same scenario, the person skilled in the art will appreciate that by virtue of having variable capacitors (C1, C4), tuning into different bands for high quality output matching is made possible. The person skilled in the art will also understand that, without departing from the scope and spirit of the invention, each passive element may comprise series and/or parallel combination of elements of the same type. As an example, variable capacitor (C1) may comprise a series and/or a parallel combination of capacitors or a combination thereof. Same applies to all inductors and resistors that are constituents of the electronic circuit (900) of FIG. 9. Different exemplary switching configurations described previously using switching configuration tables (500B, 600B, . . . 800B) are also equally applicable here for the electronic circuit (900) of FIG. 9.

With reference to FIGS. 4A-9, embodiments in accordance with the present disclosure may be envisaged where:
- The cascode configuration using transistors (T1, T2) may comprise one or more transistors.
- Transistors (T1, T2, T3) may comprise field-effect transistors (FET) or metal-oxide semiconductor field-effect transistors (MOSFETs)
- Constituent switches of the switching network may comprise field-effect transistors (FET) or metal-oxide semiconductor field-effect transistors (MOSFETs)
- The switching network may comprise one or more switches depending on the requirements.
- Constituents of such embodiments may be implemented on the same chip or on separate chips.
- A combination of transistor (T3) and current source ($I_O$) or degenerative inductor ($L_{sf}$) may be implemented according to a common source or common gate configuration.

Figure 10:
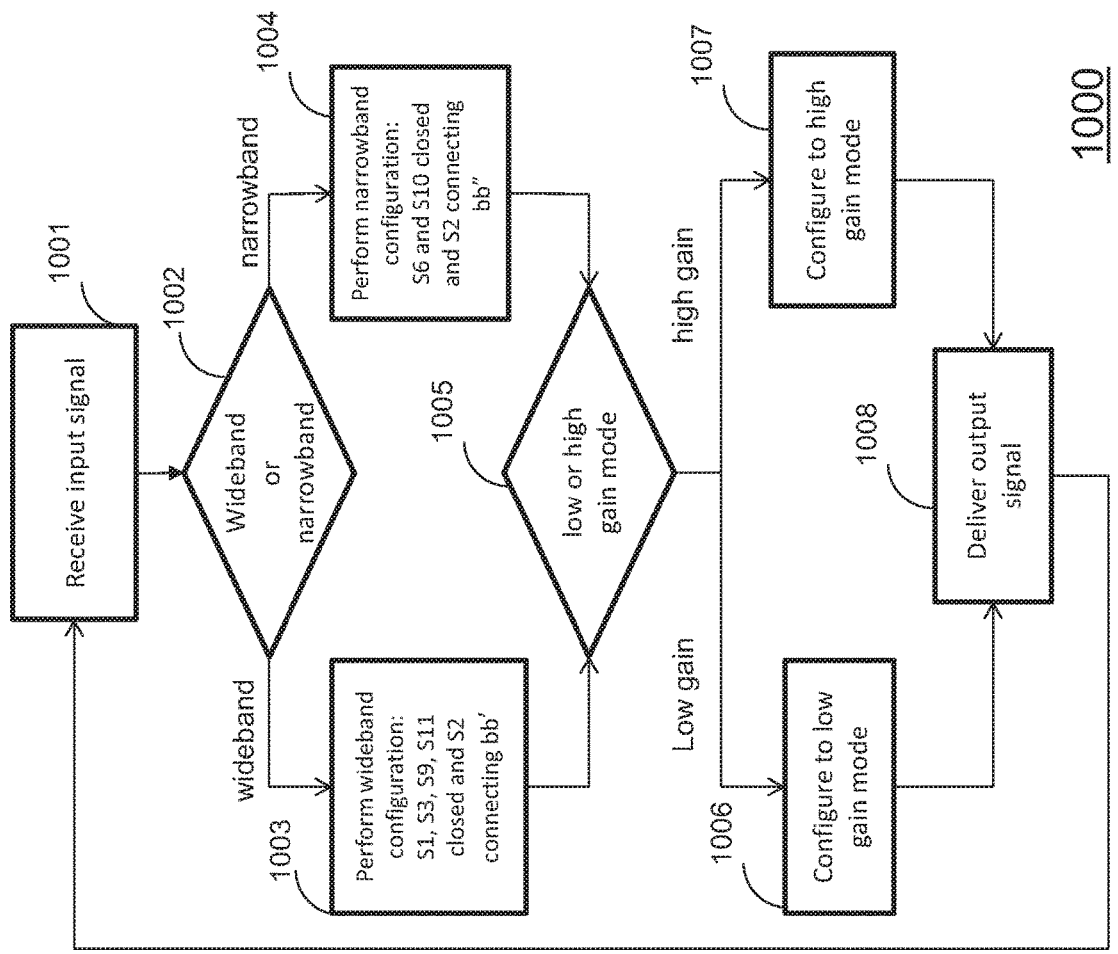
FIG. 10 shows a high level flowchart representing the reconfigurablility of RF receiver front-end designed according to the teachings of the present disclosure.

FIG. 10 shows a high-level flowchart representing the recofigurability of RF receiver front-ends designed according to the teachings of the disclosure and as controlled either by external control commands or by internal commands generated in response to internal conditions. As shown, an input signal received, step (1001). Depending on the bandwidth requirement, step (1002), the RF receiver front-end is configured to narrowband or wideband as shown in steps (1003, 1004) respectively. Moreover, depending also on gain requirements, as shown in step (1005), the RF receiver front-end is configured for a low or high gain, as shown in steps (1006, 1007) and then the output signal is generated. This is a flowchart based on exemplary requirements such as frequency ranges and gain modes just illustrating the flexibility of a design using the same hardware that can adapt to various requirements. As detailed previously, the person skilled in the art will understand that the disclosed teachings can also be used to configure RF receiver front-ends to adapt to various requirements other than gain or frequency range.

Figure 11:
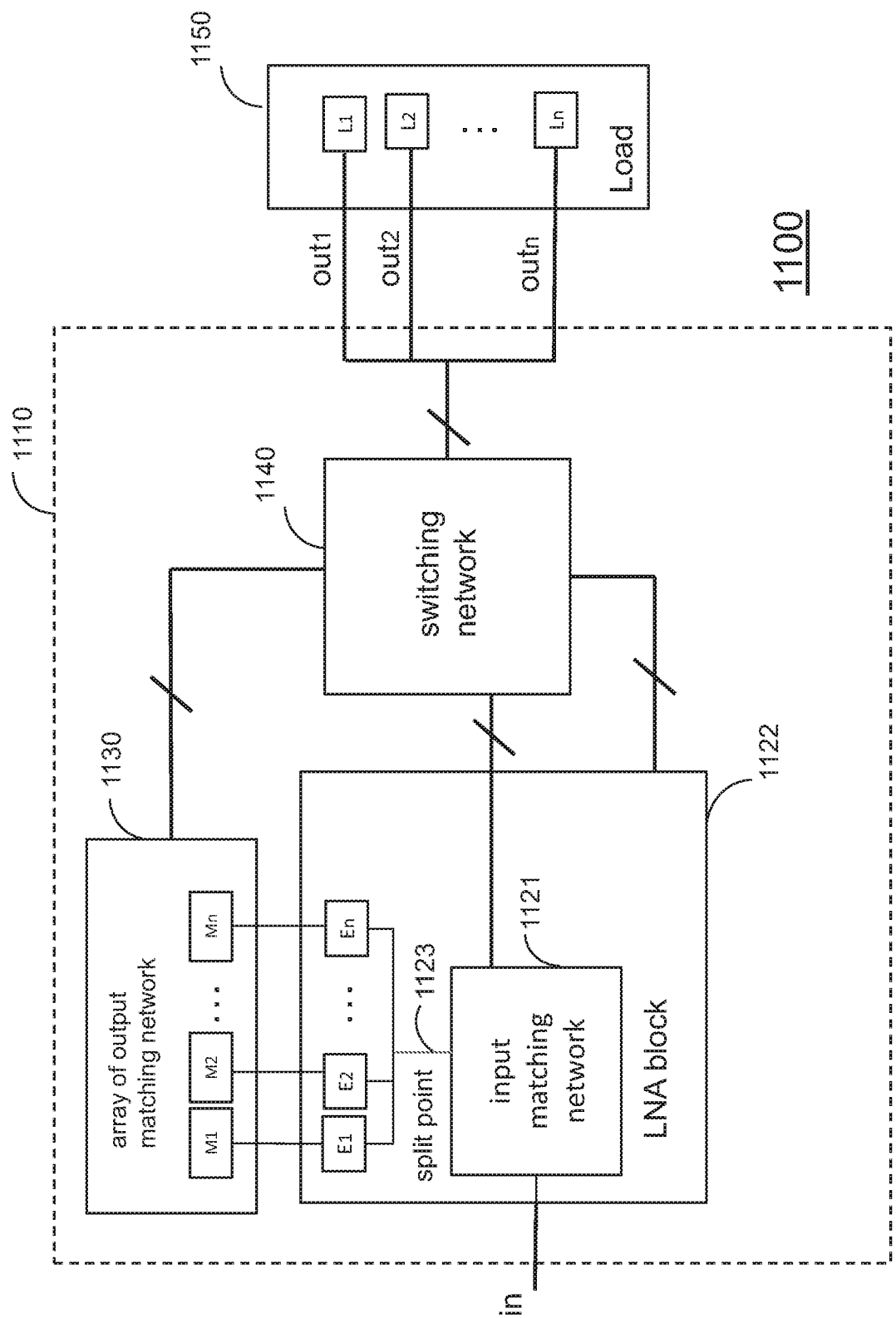
FIGS. 11-14 show electronic circuits according to embodiments of the present disclosure.

FIG. 11 shows an electronic circuit (1100) according to an embodiment of the present disclosure. The electronic circuit (1100) has some similarities with the electronic circuit (300) of FIG. 3 and provides all the benefits associated with the electronic circuit (300) of FIG. 3 as detailed previously. Additionally, the electronic circuit (1100) is designed to operate in various single and split-modes to address carrier aggregation requirements as described previously using examples from the 5G NR standard.

With reference to FIG. 11, the electronic circuit (1100) comprises an RF receiver front-end (1110) connectable to an output load (1150) having a plurality of load elements ($L_1, \ldots, L_n$). The electronic circuit (1100) is configured to receive an input signal at input (in) and to provide a plurality of corresponding output signals at outputs (out$_1$, . . . , out$_n$). The RF receiver front-end (1110) comprises an LNA block (1122), an output matching network (1130) and a switching network (1140). The LNA block (1122) comprises an input matching network (1121) connected with the plurality of electronic elements ($E_1, \ldots, E_n$). The output matching network (1130) comprises a plurality of output matching elements ($M_1, \ldots, M_n$) connected with corresponding electronic elements ($E_1, \ldots, E_n$). As shown in FIG. 11, the signal split occurs at split-point (1123), which is essentially an output of the input matching network (1121). According to embodiments of the present disclosure, and depending on the operation mode, the signal at the split-point (1123) is divided between the plurality of the electronic elements ($E_1, \ldots, E_n$). The switching network (1140) is connected to the output matching network (1130), the LNA block (1122) and the input matching network (1121) and provides the same functionalities as what was described with regards to switching network (340) of FIG. 3. In accordance with embodiments of the present disclosure, the electronic circuit (1110) may be configured to operate in various single-mode operations connecting the input (in) to any of the outputs (out$_1$, . . . , out$_n$). According to further embodiments of the present disclosure, the electronic circuit (1110) may also be configured to operate in various split-mode operations connecting the input (in) to any two or more of the outputs (out$_1$, . . . , out$_n$). In what follows, exemplary implementations of the electronic circuit (1110) in accordance with teachings of the present disclosure will be presented.

Figure 12:
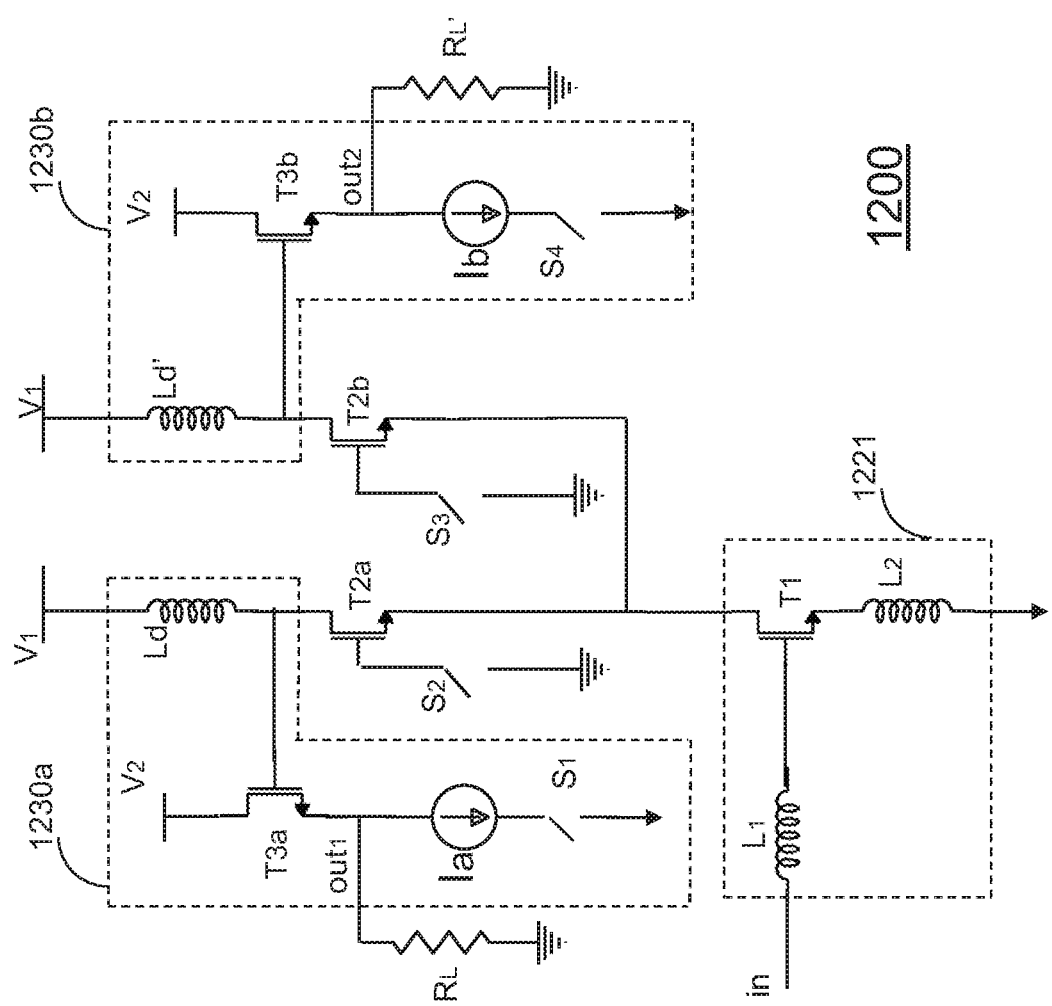

FIG. 12 shows an electronic circuit (1200) in accordance with embodiments of the present disclosure. The electronic circuit (1200) is designed to be configurable both for single-mode and split-mode operations depending on the states of switches (S$_1$, . . . , S$_4$). With reference to FIGS. 11-12, the input matching network (1221) is an exemplary implementation of the input matching network (1121) of FIG. 11. The electronic circuit (1200) further comprises two output matching network (1230a, 1230b), each of which may be an exemplary implementation of any of the output matching elements (M$_1$, . . . , M$_n$) of FIG. 11. In other words, a combination of the two output matching network (1230a, 1230b) is the counterpart of the output matching network (1130) of FIG. 11. Similarly, each of the transistors (T2a, T2b) may be an exemplary implementation of any of the electronic elements (E$_1$, . . . , E$_n$). Moreover, each of the resistors (R$_L$, R$_L$') may represent any of the load elements (L$_1$, . . . , L$_n$) of FIG. 11.

Figure 2E:
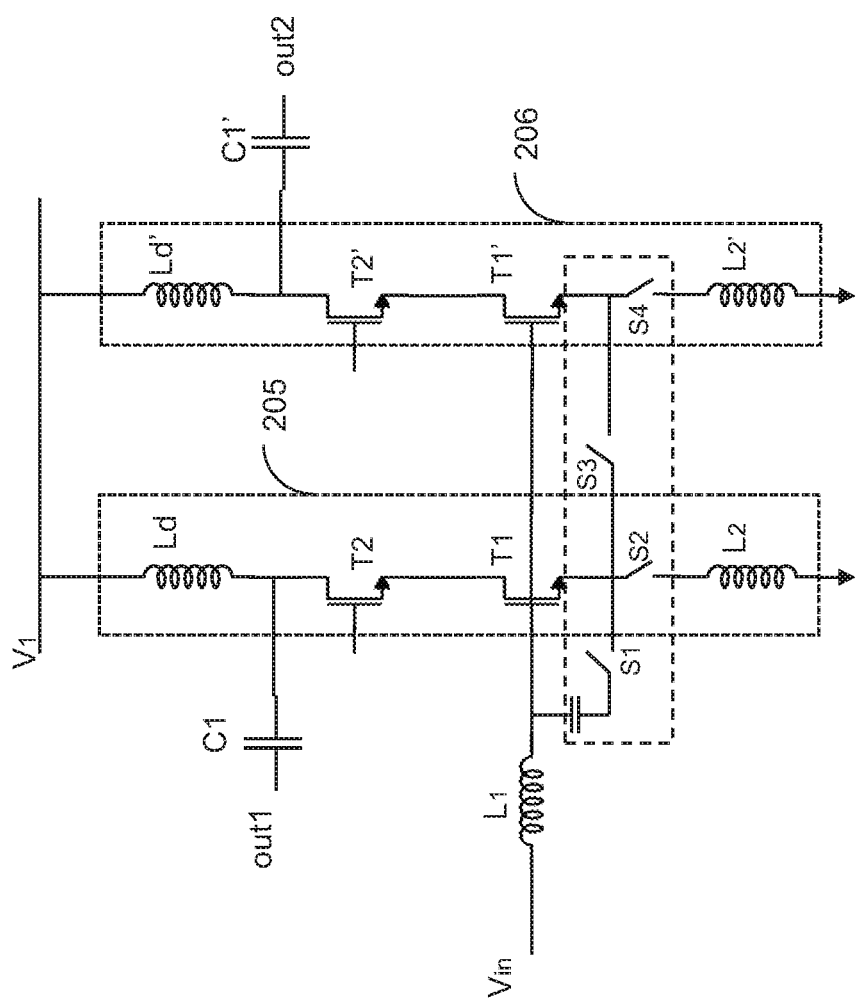
FIG. 2E shows a prior art RF receiver front-end architecture.

With further reference to FIG. 12, a combination of the transistors (T1, T2a) or transistors (T1, T2b) represent each a cascode configuration wherein the split is initiated at the drain of transistor (T1) representing essentially the counterpart of the split-point (1123) of FIG. 11. The electronic circuit (1200) is configured to receive an input signal from the input (in) and to generate output signal(s) at the one or both of outputs (out1, out2) depending on the states of switches (S$_1$, . . . , S$_4$). A combination of switches (S$_1$, . . . , S$_4$) may be an exemplary implementation of the switching network (1140) of FIG. 11. Transistors (T3a, T3b) combined with their respective current sources (Ia, Ib) represent source followers providing the wideband output matching similar to what was described with regards to some of previously described embodiments such as the embodiment as shown in FIG. 4A. With reference to FIG. 2E and FIG. 12, the person skilled in the art will appreciate that in the electronic circuit (1200) the split is initiated at the cascode transistors (drain of transistor (T1)) and the source followers provides the required isolation and impedance transformation requirements. As a result, there is no degradation of the NF performance which was the case for the front-end receiver (200E) of FIG. 2E where the split was performed at the input.

With further reference to FIG. 12, the electronic circuit (1200) has three modes of operation:

Single mode (in to out1): in this mode switch (S3) is closed and as a result, transistor (T2b) is disabled as its gate is pulled to ground. Transistor (T3b) is also disabled. This can be done either by opening switch (S4) to disable current source (Ib) or by turning off the bias voltage (V2). Switch (S2) is open and switch (S1) is closed. Transistors (T1, T2a, T3a) are enabled.

Single mode (in to out2): in this mode switch (S2) is closed and as a result, transistor (T2a) is disabled as its gate is pulled to ground. Transistor (T3a) is also disabled. This can be done either by opening switch (S1) to disable current source (Ib) or by turning off the bias voltage (V2). Switch (S3) is open and switch (S4) is closed. Transistors T1, T2b, T3b are enabled.

Split mode: Switches (S1, S4) are closed and switches (S2, S3) are open. As a result, transistors (T2a, T2b) as well as transistors (T3a, T3b) are enabled to amplify the input signal at input (in) to both outputs (out1, out2) simultaneously.

Figure 13:
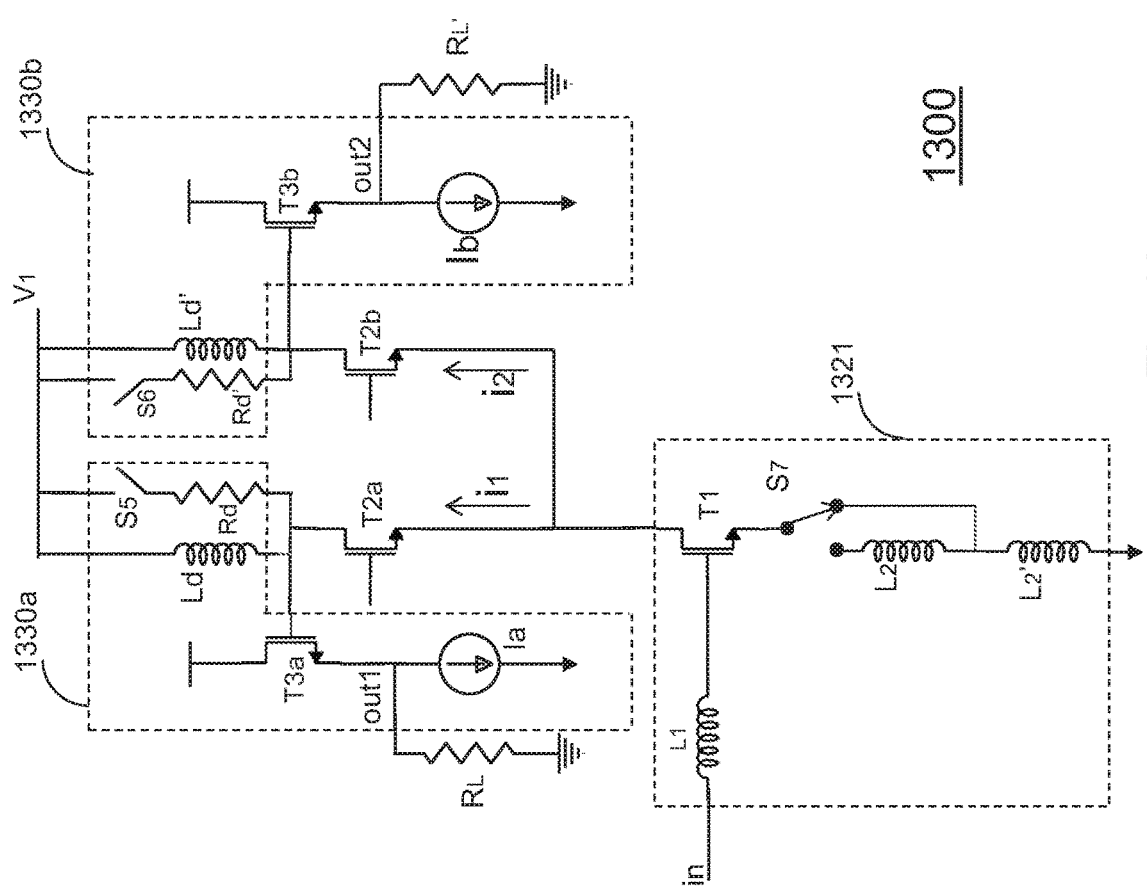

FIG. 13 shows an electronic circuit (1300) in accordance with further embodiments of the present disclosure. The principle of operation of the electronic circuit (1300) is similar to what was described with regards to electronic circuit (1200) of FIG. 12.

With reference to FIGS. 11 and 13, the input matching network (1321) is an exemplary implementation of the input matching network (1121) of FIG. 11. The electronic circuit (1300) further comprises two output matching networks (1330a, 1330b), each of which may be an exemplary implementation of any of the output matching elements (M$_1$, . . . , M$_n$) of FIG. 11. In other words, a combination of the two output matching network (1330a, 1330b) is the counterpart of the output matching network (1130) of FIG. 11. Similarly, each of the transistors (T2a, T2b) may be an exemplary implementation of any of the electronic elements (E$_1$, . . . , E$_n$). Moreover, each of the resistors (RL, RL') may represent any of the load elements (L1, . . . , Ln) of FIG. 11. A combination of switches (S$_5$, S$_6$, S$_7$) may be an exemplary implementation of some of the switches included in the switching network (1140) of FIG. 11. With reference to FIGS. 12-13, the person skilled in the art will understand that the electronic circuit (1300) may also include switches (S$_1$, . . . , S$_4$) of FIG. 12 providing the same functionalities. Such switches are not shown in FIG. 13 for the sake of clarity.

As shown in FIG. 13, the transconductance current generated by transistor (T1) is split equally into currents (i$_1$, i$_2$). Assuming everything else equal, this corresponds to 6 dB gain drop in the split-mode compared to the single-mode. In order to have substantially equal gains in both single and split-modes, one solution is to use de-Qing resistors (Rd, Rd') which may be switched in (when operating in single-mode) and out (when operating in split-mode) using their respective switches (S5, S6). By way of example, in a single-mode operation where transistors (T2a, T3a) are active, switch (S5) may be closed to switch in resistor (Rd). In this scenario, a combination of inductor (Ld) and resistor (Rd) are designed such that substantially equal gains are maintained during single and split-mode operation. According to embodiments of the present disclosure, additional capacitive switching may be implemented to maintain correct resonant frequency in all modes of operation. In other words, capacitors (not shown) may be implemented parallel with resistor (Rd) and (Rd'). Such capacitors may be switched in and out during different modes to maintain the same resonant frequency for both single and split-mode.

With further reference to FIG. 13, a combination of the switch (S7) and inductor (L2, L2') may also be used to maintain equal gains in various modes of operation. According to embodiments of the present disclosure, only inductor (L2') may be switched in during the split-mode resulting in an increase in gain at the expense of input matching performance. During the single-mode operation, the position of switch (S$_7$) may be changed to include both inductors (L2, L2') and therefore reduce the gain. Embodiments in accordance with further embodiments of the present disclosure may be envisaged wherein current sources (Ia, Ib) may be replaced by inductors. In such a case, the bias point of the source follower including transistor (T3b) is set by the gate of transistor (T3b) which may be DC-decoupled from the drain of transistor (T2b) by a series DC blocking capacitor (not shown). Similarly, the bias point of the source follower including transistor (T3a) is set by the gate of transistor (T3a) which may be DC-decoupled from the drain of transistor (T2a) by a series DC blocking capacitor (not shown).

Figure 14:
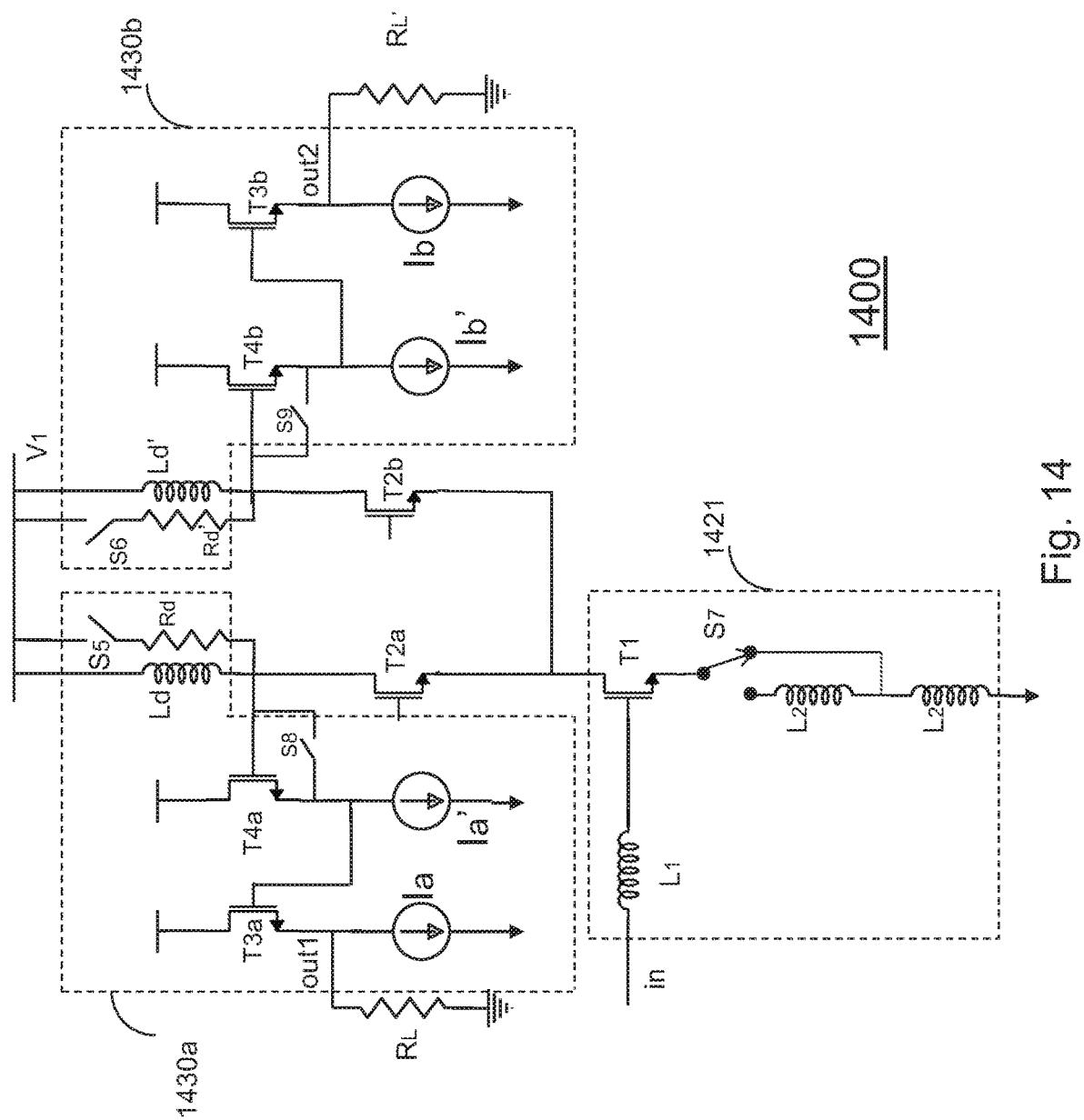

FIG. 14 shows an electronic circuit (1400) in accordance with other embodiments of the present disclosure. With reference to FIGS. 11 and 14, the input matching network (1421) is an exemplary implementation of the input matching network (1121) of FIG. 11. The electronic circuit (1400) further comprises two output matching network (1430a, 1430b), each of which may be an exemplary implementation of any of the output matching elements ($M_1, \ldots, M_n$) of FIG. 11. In other words, a combination of the two output matching networks (1430a, 1430b) is the counterpart of the output matching network (1130) of FIG. 11. Similarly, each of the transistors (T2a, T2b) may be an exemplary implementation of any of the electronic elements ($E_1, \ldots, E_n$). Moreover, each of the resistors (RL, RL') may represent any of the load elements ($L_1, \ldots, L_n$) of FIG. 11. A combination of switches ($S_5, S_6, S_7$) may be an exemplary implementation of the some of the switches included in the switching network (1140) of FIG. 11. With reference to FIGS. 12 and 14, the person skilled in the art will understand that the electronic circuit (1400) may also include switches ($S_1, \ldots, S_4$) of FIG. 12 providing the same functionalities. Such switches are not shown in FIG. 14 for the sake of clarity With reference to FIGS. 13-14, the principle of operation of the electronic circuit (1400) is similar to what was described with regards to electronic circuit (1300) of FIG. 13, except that there are two additional source-followers implemented using transistor (T4a) together with current source (Ia') as well as transistor (T4b) together with its associated current source (Ib'). At the expense of additional DC currents due to current sources (Ia', Ib'), such architecture provides improved output-to-output isolation by adding extra output buffer stages. Since transistors (T4a, T4b) drive the high-impedance gates of transistors (T3a, T3b) respectively, transistors (T4a, T4b) may not have current requirements that transistors (T3a, T3b) may have to drive 50 Ohm loads. Therefore, the DC current (Ia') may be smaller than current (Ia) and DC current (Ib') may be smaller than DC current (Ib). In single-mode operations where output-output isolation may not be required, transistors (T4a, T4b) may be bypassed by closing switches ($S_8, S_9$) respectively, and current sources (Ia', Ib') may be shut down.

Referring back to FIG. 11, the person skilled in the art will understand that the embodiments of FIGS. 12-14 represent exemplary implementations of the embodiment shown in FIG. 11. Without departing from the scope and spirit of the invention, further embodiments may be envisaged using various designs and concepts as disclosed previously and with regards to embodiments of FIGS. 4A-9. By way of example, and not of limitation, and with continued reference to FIG. 11, embodiments may be made wherein:

the input matching network (1121) may be implemented using the input matching network (421) of FIG. 4A
One or more matching elements of the plurality of matching elements ($M_1, \ldots, M_n$) of the output matching network (1130) may be implemented using the output matching network (430) of FIG. 4A
One or more matching elements of the plurality of matching elements ($M_1, \ldots, M_n$) of the output matching network (1130) may be implemented using the output matching network (930) of FIG. 9
The switching network (1140) may be implemented using the switching network (440) of FIG. 4B, and based on any configurations as shown in the tables of FIGS. 5B-8B.
One or more electronic elements of the plurality of electronic elements ($E_1, \ldots, E_n$) of the LNA block (1122) may be implemented using a transistor, similar to what was described with regards to embodiments shown in FIGS. 12-14.

Making further reference to FIG. 11, and according to various embodiments of the present disclosure:

All electronic elements of the plurality of electronic elements ($E_1, \ldots, E_n$) may be the same.
At least one electronic element of the plurality of electronic elements ($E_1, \ldots, E_n$) may be different from other electronic elements of the plurality of electronic elements ($E_1, \ldots, E_n$).
Each electronic element of plurality of electronic elements ($E_1, \ldots, E_n$) may be different from any other electronic element of the plurality of electronic elements ($E_1, \ldots, E_n$).
All output matching elements of the plurality of output matching elements ($M_1, \ldots, M_n$) may be the same.
At least one output matching element of the plurality of output matching elements ($M_1, \ldots, M_n$) may be different from other output matching elements of the plurality of output matching elements ($M_1, \ldots, M_n$).
Each output matching element of the plurality of output matching elements ($M_1, \ldots, M_n$) may be different from any other output matching elements of the plurality of output matching elements ($M_1, \ldots, M_n$).

Figure 15:
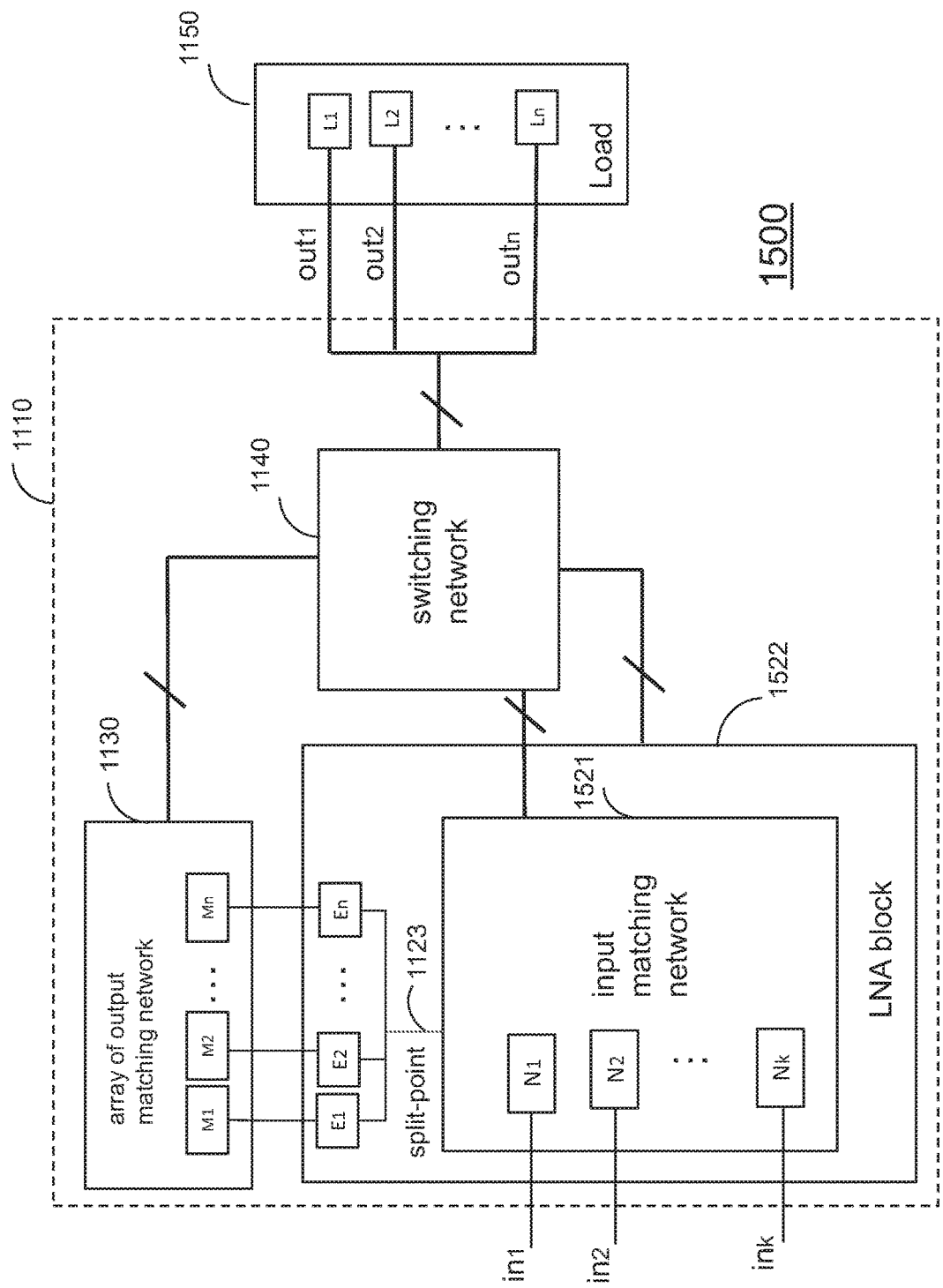
FIGS. 15-16 show multiple-input, multiple-output electronic circuits according to further embodiments of the present disclosure

FIG. 15 shows an electronic circuit (1500) according to an embodiment of the present disclosure. The electronic circuit (1500) has some similarities with the electronic circuit (1100) of FIG. 11 and provides all the benefits associated with the electronic circuit (300) of FIG. 3 as detailed previously. Additionally, the electronic circuit (1500) may be configured to receive one or more input signal from inputs ($in_1, \ldots, in_k$). Similar to what was described with regards to the electronic circuit (1100) of FIG. 11, the electronic circuit (1500) may be configured to provide output signals to one or more outputs ($out_1, \ldots, out_n$), wherein 'k' and 'n' are integers larger than 1. The electronic circuit (1500) is essentially a multiple-input, multiple-output circuit providing all the benefits as described with regards to the electronic circuit (1100) of FIG. 11 as well as the capability of handling more than one input signal. According to embodiments of the present disclosure, the electronic circuit (1500) may be configured for:

various single-mode operations involving an input signals received from any one of the inputs ($in_1, \ldots, in_k$) to provide an output signal at any one of the outputs ($out_1, \ldots, out_n$), and
various split-mode operations involving 'i' input signals received from any 'i' inputs ($in_1, \ldots, in_k$) to provide 'j' output signals at any 'j' outputs ($out_1, \ldots, out_n$) wherein 'i' and 'j' are integers, and wherein 'i' is larger or equal to 1 and 'j' is larger or equal to 'i'.

Figure 16:
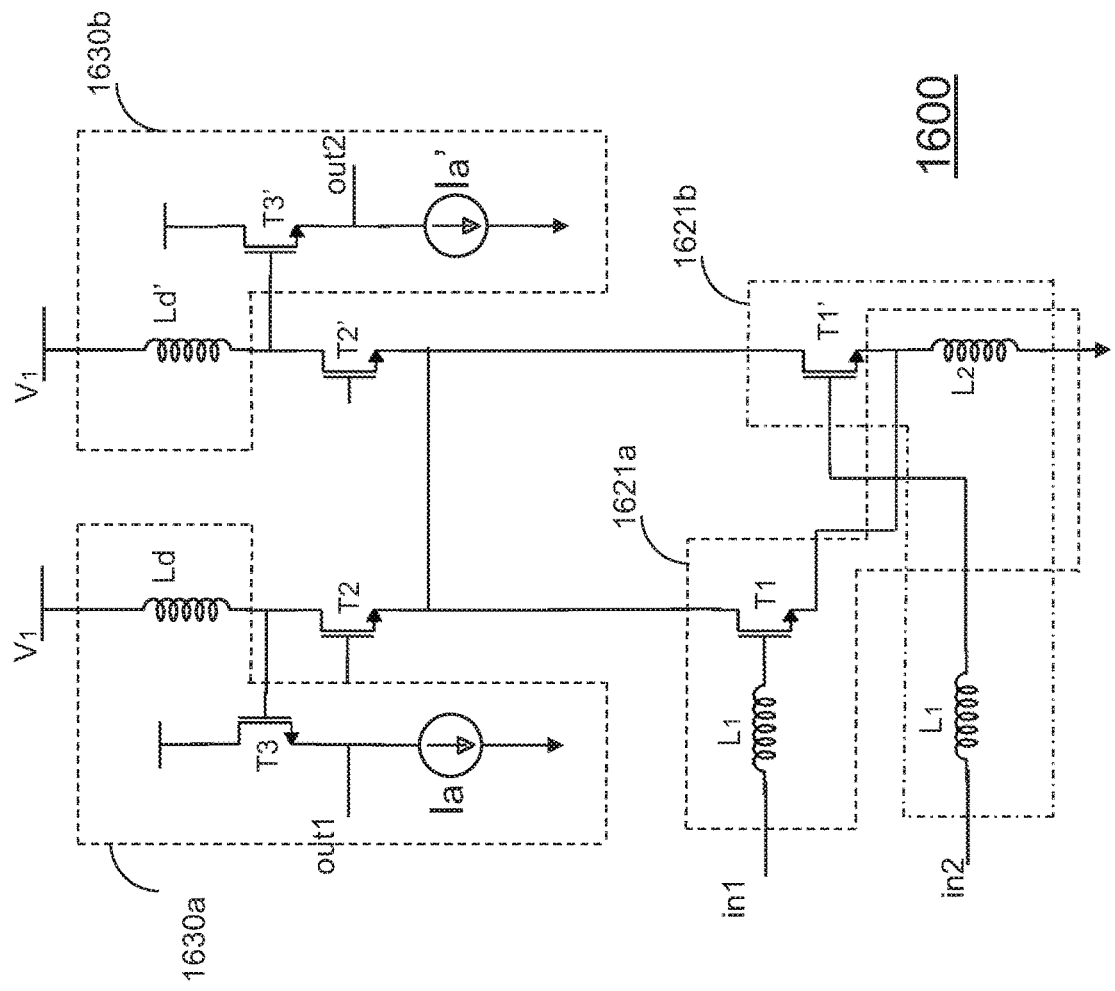

FIG. 16 shows an electronic circuit (1600) in accordance with an embodiment of the present disclosure. The electronic circuit (1600) is an exemplary implementation of the electronic circuit (1500) of FIG. 15. The electronic circuit (1600) is essentially a multiple-input, multiple-output circuit and may be configured to receive two input signals at inputs (in1, in2) and generate two output signals at outputs (out1, out2). Transistors (T1, T1') are configured as common-source transistors and transistors (T2, T2') are configured as cascode transistors. As also shown in FIG. 15, and similar to what was described previously, the split is initiated at cascode transistors, in other words at drains of transistors (T1, T1'). Transistors (T3, T3') together with their respective current sources (Ia, Ia') are source-followers used for improved output matching. According to embodiments of the disclosure, the electronic circuit (1600) may have the following modes of operation:

Single-mode (in1 to out1): transistors (T1, T2, T3) are active and all other transistors are inactive.
Single-mode (in1 to out2): transistors (T1, T2', T3') are active and all other transistors are inactive.
Single-mode (in2 to out1): transistors (T1', T2, T3) are active and all other transistors are inactive.
Single-mode (in2 to out2): transistors (T1', T2', T3') are active and all other transistors are inactive.
Split-mode (in1 to out1 and out2): transistors (T1, T2, T3, T2', T3') are active. Transistor (T1') is inactive.
Split-mode (in2 to out1 and out2): transistors (T1', T2, T3, T2', T3') are active. Transistor (T1) is inactive.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A Radio Frequency (RF) receiver front-end comprising:
   an input and a plurality of outputs;
   a reconfigurable low noise amplifier (LNA) block having an input matching network, and a plurality of electronic elements each having an electronic element output;
   an output matching network having a plurality of output matching elements; and
   a switching network;
   wherein:
      each output matching element of the plurality of output matching elements is connected with a corresponding output of the plurality of outputs;
      the switching network is connected to the input matching network, the LNA block and the output matching network;
      during a first mode of operation:
         i) in a first configuration, switches of the switching network:
            enable a single electronic element of the plurality of electronic elements and a corresponding output matching element; and
            disable remaining electronic elements of the plurality of electronic elements and corresponding output matching elements;
         ii) the RF receiver front-end is configured to receive an input signal at the input and generate a corresponding output signal at an output of the plurality of outputs, and
      during a second mode of operation:
         i) in a second configuration, the switches of the plurality of switches enable two or more electronic elements of the plurality of electronic elements and corresponding output matching elements of the plurality of output matching elements; and
         ii) the RF receiver front-end is configured to receive the input signal at the input and generate two or more corresponding output signals at two or more outputs of the plurality of outputs.

2. The RF receiver front-end of claim 1, wherein the switching network is used to configure or reconfigure the RF receiver front-end to operate at one or more frequency ranges.

3. The RF receiver front-end of claim 2, wherein the one or more frequency ranges comprises at least a narrowband, and a wideband frequency range.

4. The RF receiver front-end of claim 3, wherein the narrowband and the wideband frequency ranges are intraband, non-contiguous frequency ranges.

5. The RF receiver front-end of claim 4, wherein the plurality of output matching elements comprises each one of a) one or more passive elements, b) one or more active elements, or a combination thereof.

6. The RF receiver front-end of claim 5, wherein the RF receiver front-end comprises a feedback network selectively connecting one or more electronic element outputs to a gate of an input transistor, the input transistor being configured to receive the input signal.

7. The RF receiver front-end of claim 6, wherein the feedback network comprises one or more resistors.

8. The RF receiver front-end of claim 7, wherein the input matching network further comprises:
   a first input matching network inductor connected to the gate of the input transistor;
   a second input matching inductor connecting a source of the input transistor to ground; and
   an input matching capacitor selectively connectable across a gate-source of the input transistor.

9. The RF receiver front-end of claim 8, wherein the input matching capacitor is a variable capacitor.

10. The RF receiver front-end of claim 6, wherein the one or more active elements comprise a first source-follower transistor implemented in a source-follower configuration.

11. The RF receiver front-end of claim 10, wherein a source of the first source-follower transistor is connected to a first current source or to a first inductor.

12. The RF receiver front-end of claim 11, wherein a gate of the first source-follower transistor is selectively connectable to a corresponding electronic element output or to ground, and wherein the source of the first source-follower transistor is selectively connectable to a corresponding electronic element output and/or to a corresponding output of the plurality of outputs.

13. The RF receiver front-end of claim 12, wherein a drain of the first source-follower transistor is configured to receive a first bias voltage.

14. The RF receiver front-end of claim 13, wherein two or more passive elements of the one or more passive elements are selectively inter-connectable to one another.

15. The RF receiver front-end of claim 14, wherein the one or more passive elements is configured to receive a second bias voltage, and wherein the one or more passive elements is selectively connectable to a corresponding output of the plurality of outputs.

16. The RF receiver front-end of claim 15, wherein at least one passive element of the one or more passive elements is selectively connectable to a corresponding electronic element output.

17. The RF receiver front-end of claim 16, wherein the one or more passive elements comprises a plurality of inductors, a plurality of capacitors and a plurality of resistors.

18. The RF receiver front-end of claim 17, wherein:
   at least one inductor of the plurality of inductors is a variable inductor,
   at least one capacitor of the plurality of capacitors is a variable capacitor; and
   at least one resistor of the plurality of resistors is a variable resistor.

19. The RF receiver front-end of claim 9, wherein a narrowband input matching is performed by a) opening a first switch of the switching network, thereby disconnecting the gate of the input transistor from the corresponding electronic element output, b) closing a second switch of the switching network, thereby connecting the input matching capacitor across the gate-source of the input transistor, or a combination of a) and b).

20. The RF receiver front-end of claim 9, wherein a wideband input matching is performed by a) closing a first switch of the switching network, thereby connecting the gate of the input transistor through the feedback network with the corresponding electronic elements output, and b) opening a second switch of the switching network thereby switching out the input matching capacitor.

21. The RF receiver front-end of claim 16, wherein a wideband output matching is performed by:
   connecting the gate of the first source-follower transistor to the corresponding electronic element output;
   disconnecting the one or more passive element from a corresponding output of the plurality of outputs; and
   connecting the source of the first source-follower transistor to a corresponding output of the plurality of outputs.

22. The RF receiver front-end of claim 16, wherein a wideband output matching is performed by closing a subset of switches of the switching network to inter-connect a subset of passive elements of the one or more passive elements.

23. The RF receiver front-end claim 17 configured such that the input signal experiences a first gain or a second gain from the input to an output of the plurality of outputs, wherein:
   the first gain is achieved by selectively switching in a de-Qing resistor of the plurality of resistor;
   the second gain is achieved by selectively switching out the de-Qing resistor of the plurality if resistor; and
   the first gain is smaller than the second gain.

24. The RF receiver front-end of claim 5, wherein the input transistor and the cascode transistor are field-effect-transistors (FETs) or metal-oxide filed-effect-transistors (MOSFETs).

25. The RF receiver front-end of claim 1 implemented on a single die or chip.

26. The RF receiver front-end of claim 12, wherein at least one output matching of the plurality of output matching elements further comprises a second source-follower transistor connected with the first source-follower transistor, a source of the second source-follower transistor connected with a second current source or to a second degenerative inductor.

27. A Radio Frequency (RF) receiver front-end comprising:
   a plurality of inputs and a plurality of outputs;
   a reconfigurable low noise amplifier (LNA) block having an input matching network, a plurality of electronic elements;
   an output matching network having a plurality of output matching elements; and
   a switching network;
   wherein:
      the input matching network comprises a plurality of input matching elements connected with corresponding inputs;
      each output matching element of the plurality of output matching elements is connected with a corresponding output of the plurality of outputs;
      the switching network is connected to the input matching network, the LNA block and the output matching network; and the switching network is to:
- configure or reconfigure the plurality of input matching elements to receive one or more input signals from the plurality of inputs; and
- configure or reconfigure the plurality of electronic elements and corresponding output matching elements to generate two or more output signals at two or more outputs.

28. A method of amplifying an input signal received at an RF receiver front-end comprising:
- providing and input and a plurality of outputs;
- providing an LNA block with an input matching network and a plurality of electronic elements;
- providing an output matching network with a plurality of output matching elements;
- connecting each output matching element of the plurality of output matching elements with a corresponding output of the plurality of outputs;
- providing a switching network connected with the LNA block, the input matching network and the output marching network;
- during a first mode of operation, configuring switches of the switching network in order to:
  - enable a single electronic element of the plurality of electronic elements and corresponding output matching elements;
  - disable remaining electronic elements of the plurality of electronic elements and corresponding output matching elements; and
  - receive an input signal at the input and generate a corresponding output signal at an output of the plurality of outputs;
- during a second mode of operation, configuring the switches of the switching network in order to:
  - enable two or more electronic elements of the plurality of electronic elements and corresponding output matching elements; and
  - receive the input signal at the input and generate two or more corresponding output signals at two or more outputs of the plurality of outputs.

\* \* \* \* \*